(12) United States Patent
Kusunoki et al.

(10) Patent No.: US 12,400,823 B2
(45) Date of Patent: Aug. 26, 2025

(54) ELECTRON SOURCE, METHOD OF MANUFACTURING THE SAME, AND ELECTRON BEAM APPARATUS USING THE SAME

(71) Applicant: Hitachi High-Tech Corporation, Tokyo (JP)

(72) Inventors: Toshiaki Kusunoki, Tokyo (JP); Noriaki Arai, Tokyo (JP); Tomihiro Hashizume, Tokyo (JP); Keigo Kasuya, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 425 days.

(21) Appl. No.: 18/018,900

(22) PCT Filed: Sep. 23, 2020

(86) PCT No.: PCT/JP2020/035749
§ 371 (c)(1),
(2) Date: Jan. 31, 2023

(87) PCT Pub. No.: WO2022/064557
PCT Pub. Date: Mar. 31, 2022

(65) Prior Publication Data
US 2023/0317401 A1    Oct. 5, 2023

(51) Int. Cl.
*H01J 37/073* (2006.01)
*H01J 9/02* (2006.01)
(Continued)

(52) U.S. Cl.
CPC ............ *H01J 37/073* (2013.01); *H01J 9/025* (2013.01); *H01J 9/04* (2013.01); *H01J 37/075* (2013.01);
(Continued)

(58) Field of Classification Search
CPC .......... H01J 37/00; H01J 37/02; H01J 37/073; H01J 37/075; H01J 37/26; H01J 37/28;
(Continued)

(56) References Cited

U.S. PATENT DOCUMENTS

2010/0119825 A1\* 5/2010 Chin Li Cheung ..... H01J 9/025
428/399
2018/0019091 A1    1/2018 Tang et al.
(Continued)

FOREIGN PATENT DOCUMENTS

JP    56-93244 A    7/1981
JP    57-141839 A    9/1982
(Continued)

OTHER PUBLICATIONS

International Search Report (PCT/ISA/210) issued in PCT Application No. PCT/JP2020/035749 dated Dec. 8, 2020 with English translation (five (5) pages).
Japanese-language Written Opinion (PCT/ISA/237) issued in PCT Application No. PCT/JP2020/035749 dated Dec. 8, 2020 (three (3) pages).

*Primary Examiner* — Jason L McCormack
(74) *Attorney, Agent, or Firm* — Crowell & Moring LLP

(57) ABSTRACT

The current stability of a field emission electron source and a Schottky electron source where a {100} plane of a hexaboride single crystal is used as an electron emission surface is improved. The electron source includes a tip of a hexaboride single crystal with a <100> axis, in which a top facet of a {100} plane that is surrounded by side facets including at least four {n11} planes and at least four {n10} planes where n represents an integer of 1, 2, or 3 is formed at a front end of the tip of the hexaboride single crystal, and a total area of the side facets of the {n11} planes is more than a total area of the side facets of the {n10} planes.

15 Claims, 23 Drawing Sheets

(51) Int. Cl.
*H01J 9/04* (2006.01)
*H01J 37/075* (2006.01)
*H01J 37/28* (2006.01)

(52) U.S. Cl.
CPC ..... *H01J 37/28* (2013.01); *H01J 2237/06316* (2013.01); *H01J 2237/06341* (2013.01)

(58) Field of Classification Search
CPC ...... H01J 9/025; H01J 9/04; H01J 9/02; H01J 2237/06316; H01J 2237/06341; H01J 2237/28; H01J 35/064; H01J 2235/062; H01J 1/30
USPC .............................. 250/306, 307, 311, 396 R
See application file for complete search history.

(56) References Cited

U.S. PATENT DOCUMENTS

2019/0237289 A1* 8/2019 Kasuya ................. H01J 9/025
2019/0385809 A1 12/2019 Kusunoki et al.

FOREIGN PATENT DOCUMENTS

| JP | 60-31059 B2 | 7/1985 |
| JP | 5660564 B2 | 1/2015 |
| JP | 2018-142453 A | 9/2018 |
| WO | WO 2016/140177 A1 | 9/2016 |
| WO | WO 2018/070010 A1 | 4/2018 |

* cited by examiner

[FIG. 2]
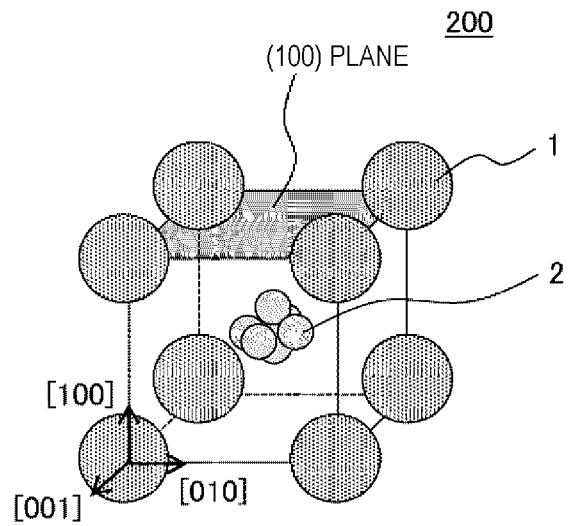
[FIG. 3]
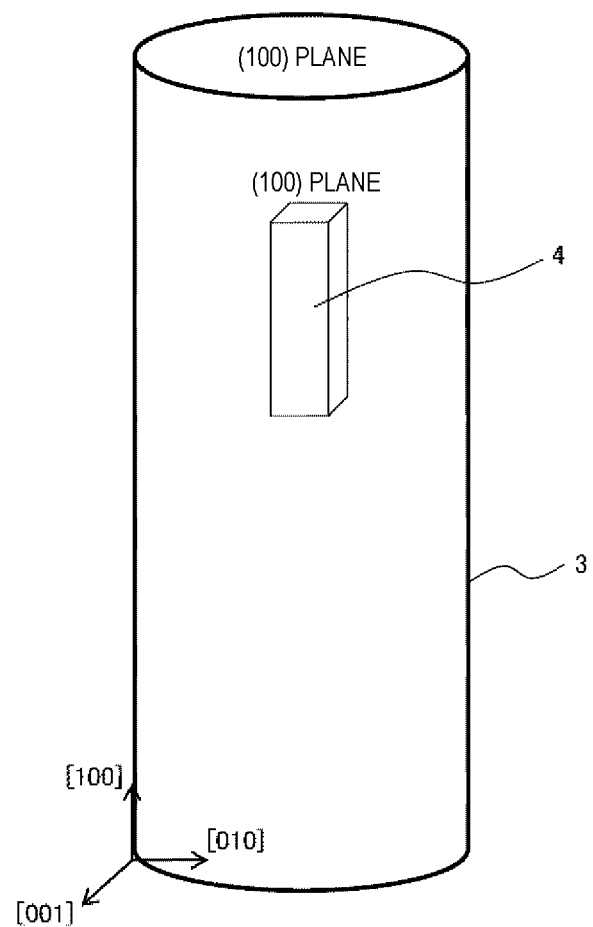

[FIG. 4]
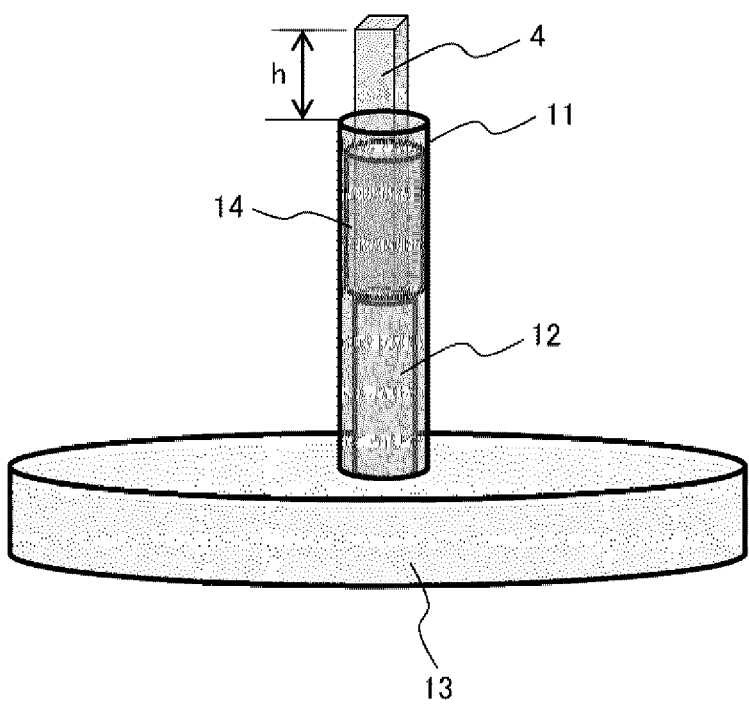

[FIG. 5]
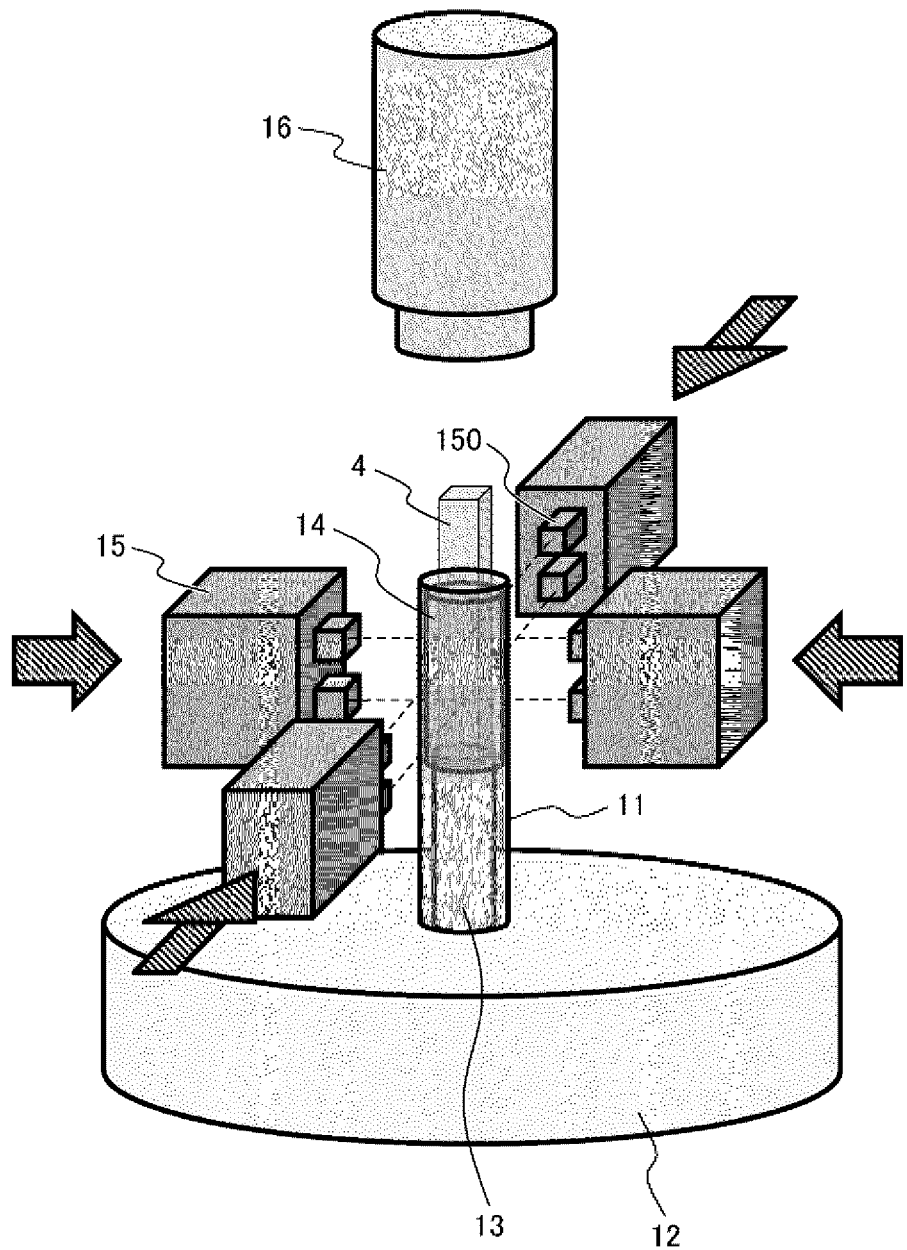

[FIG. 7]
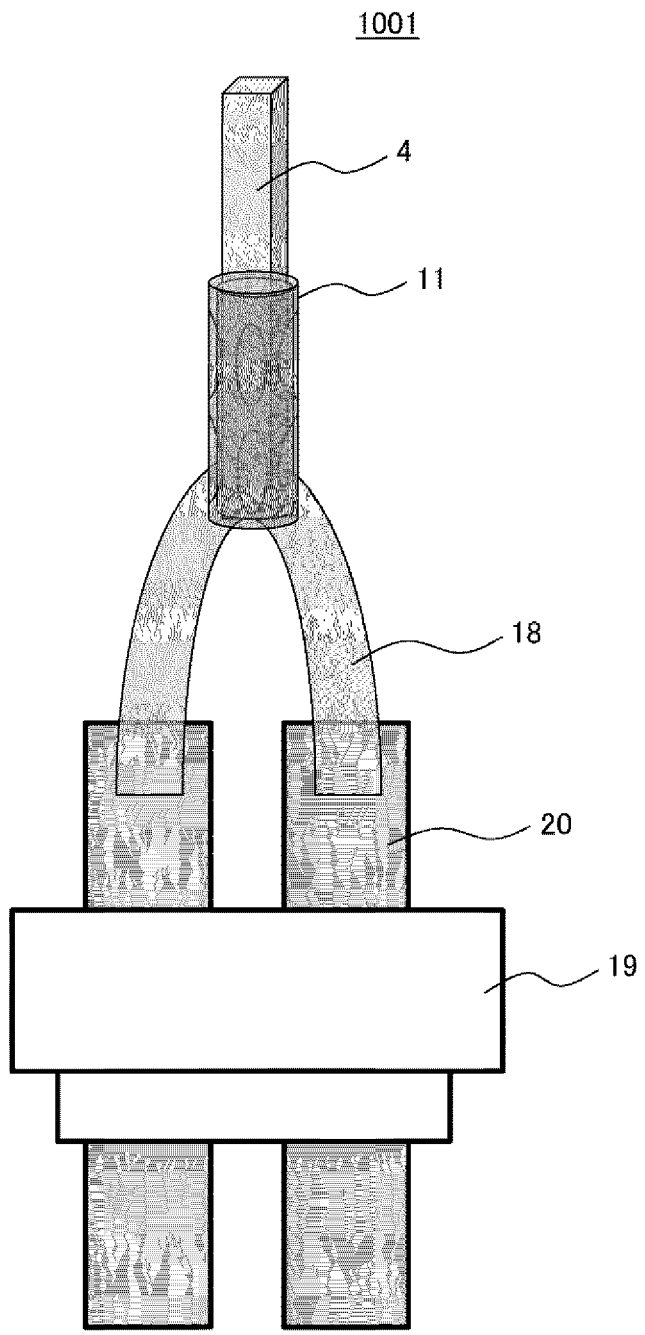

[FIG. 10]
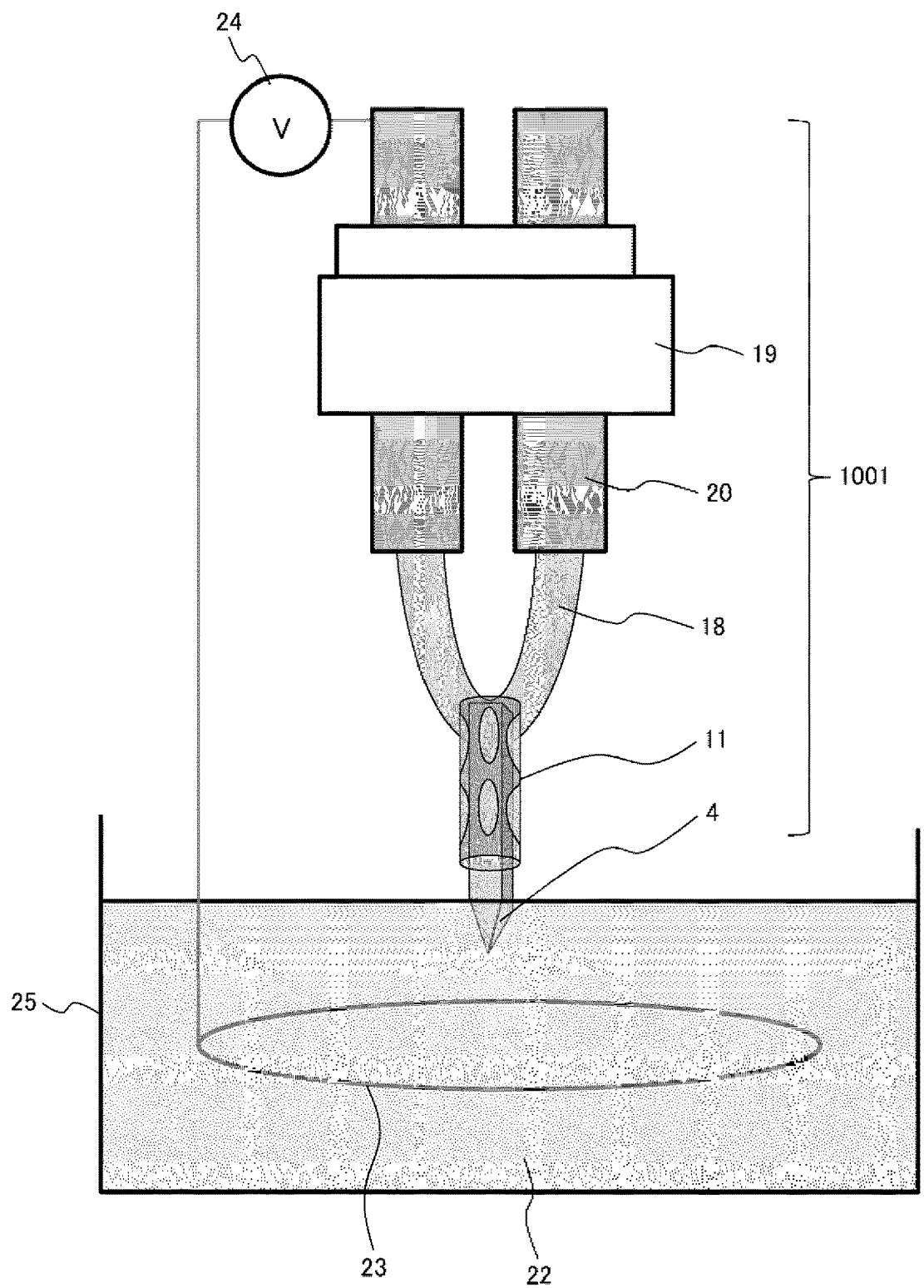

[FIG. 11]
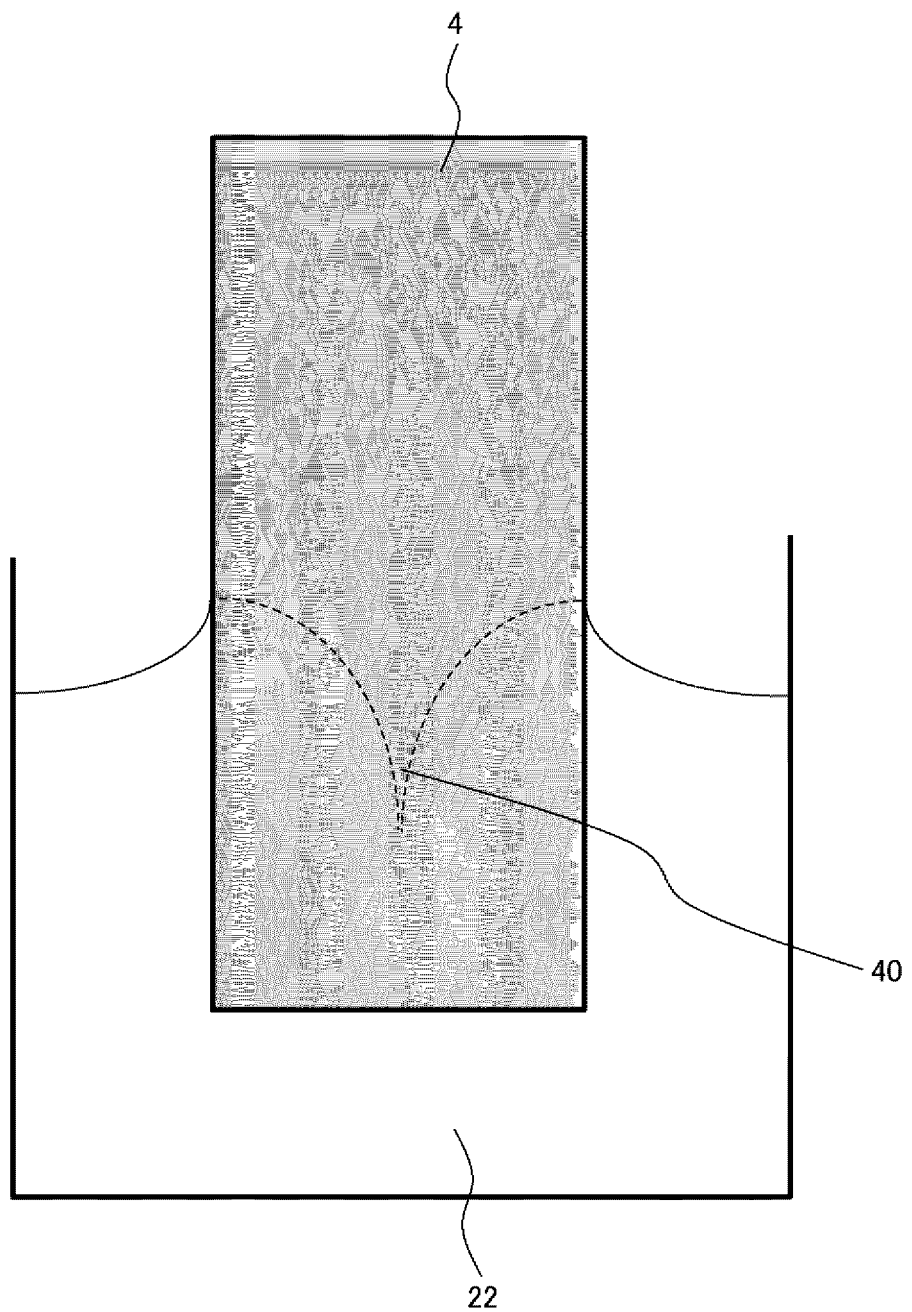

[FIG. 14]
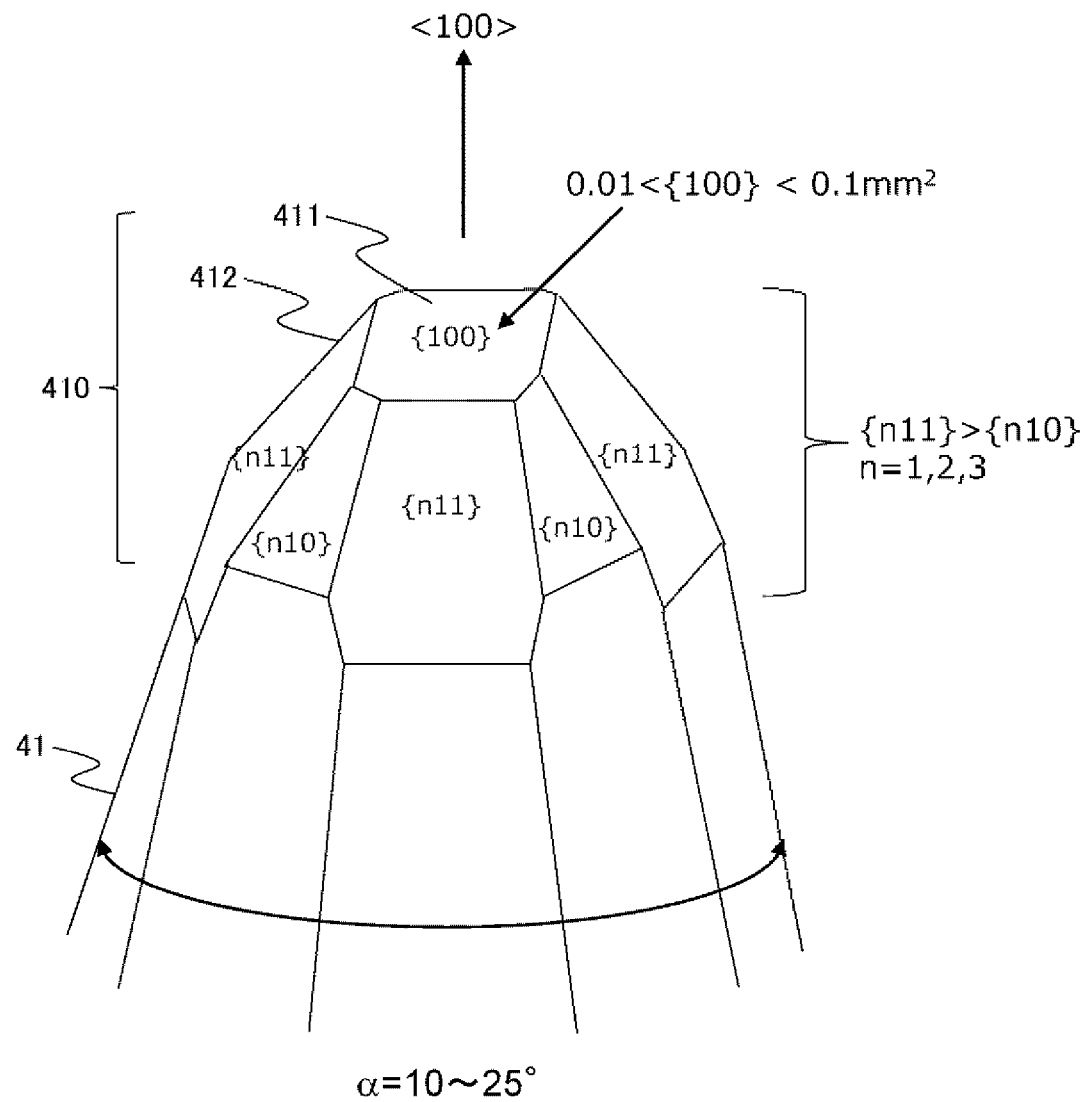

[FIG. 15]
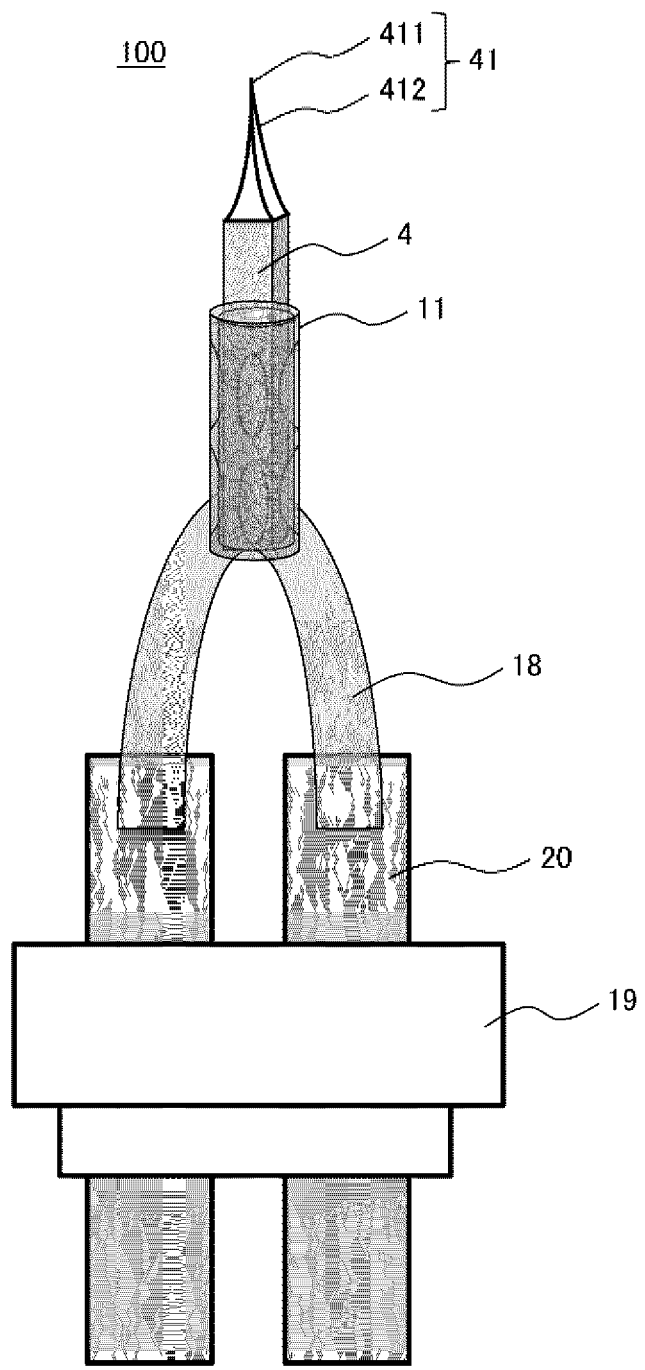

[FIG. 16]
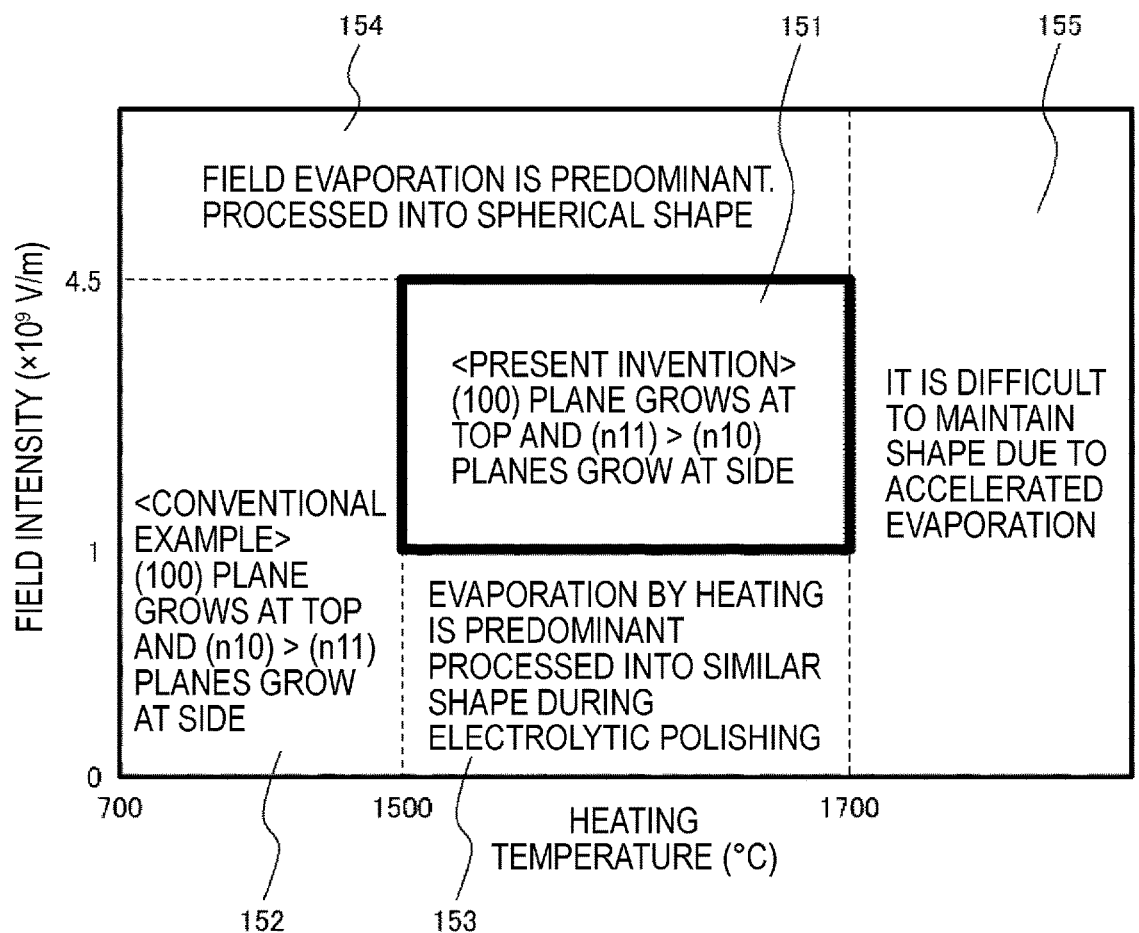

[FIG. 18]
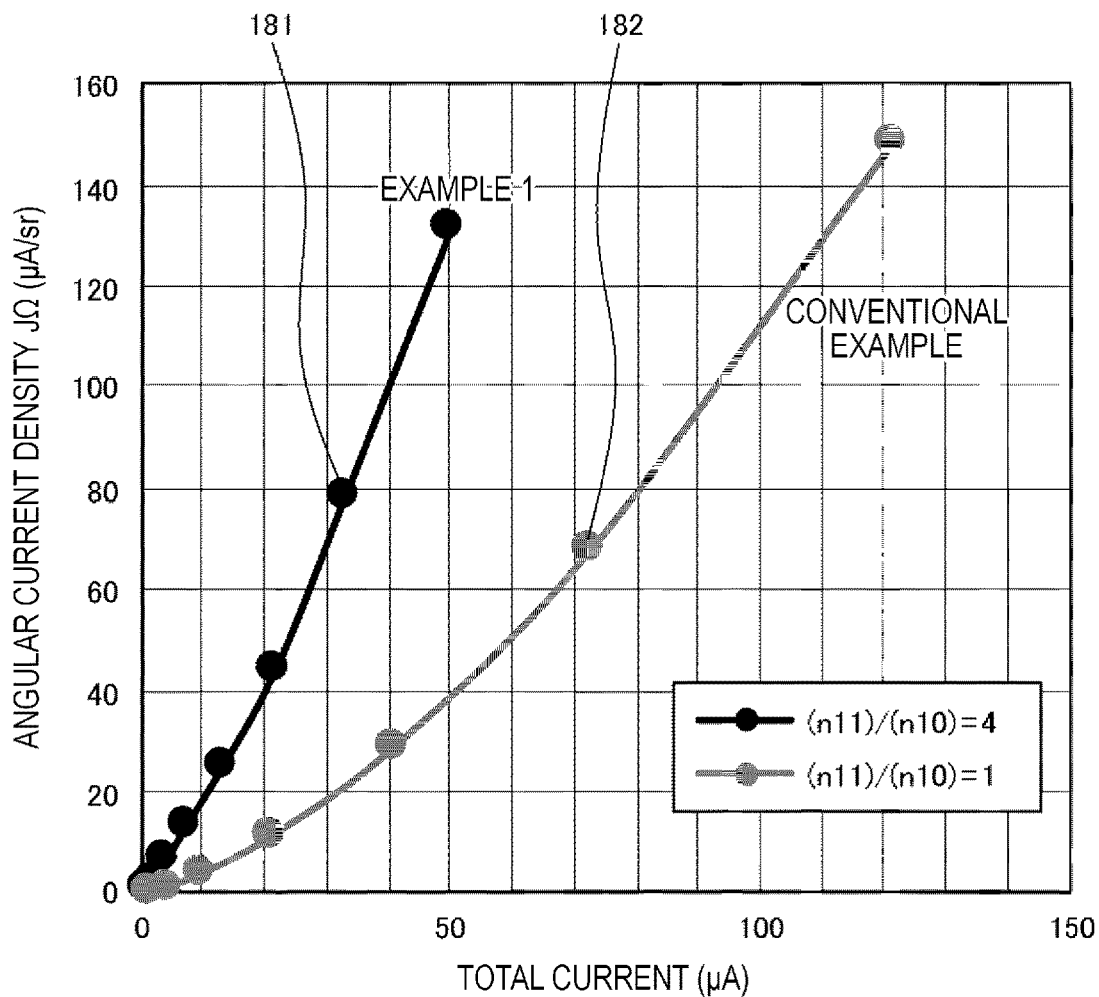

[FIG. 19]
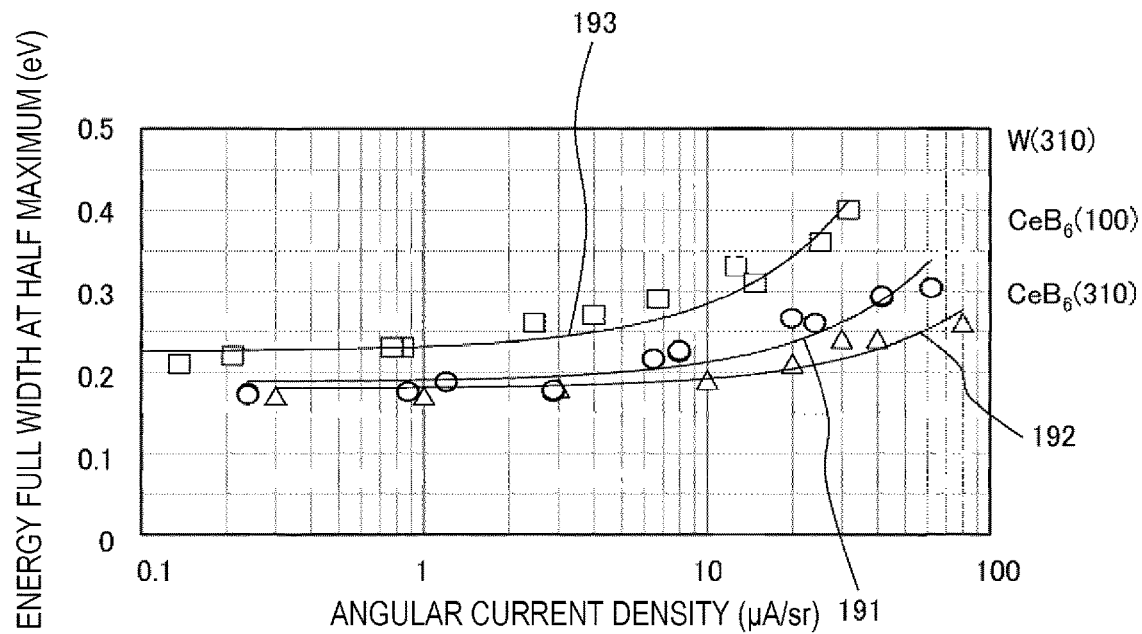

[FIG. 22]
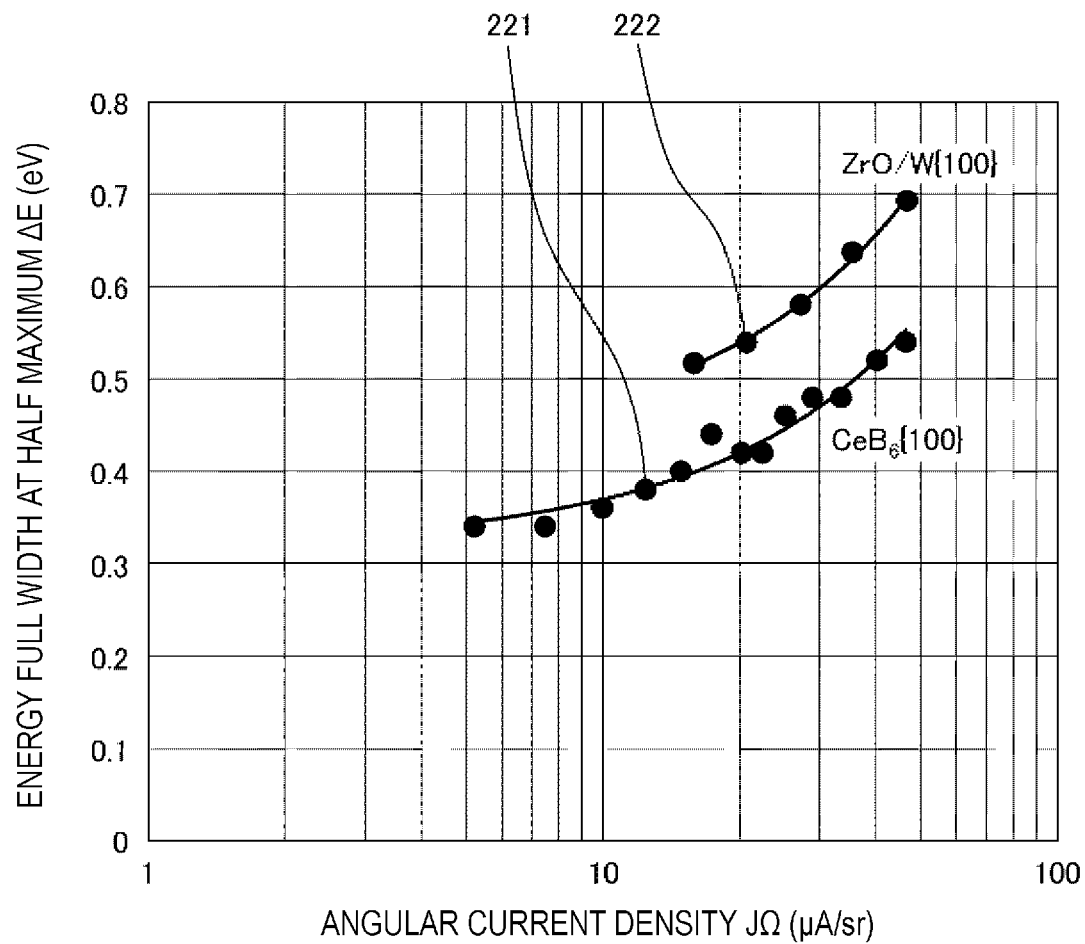

[FIG. 24]
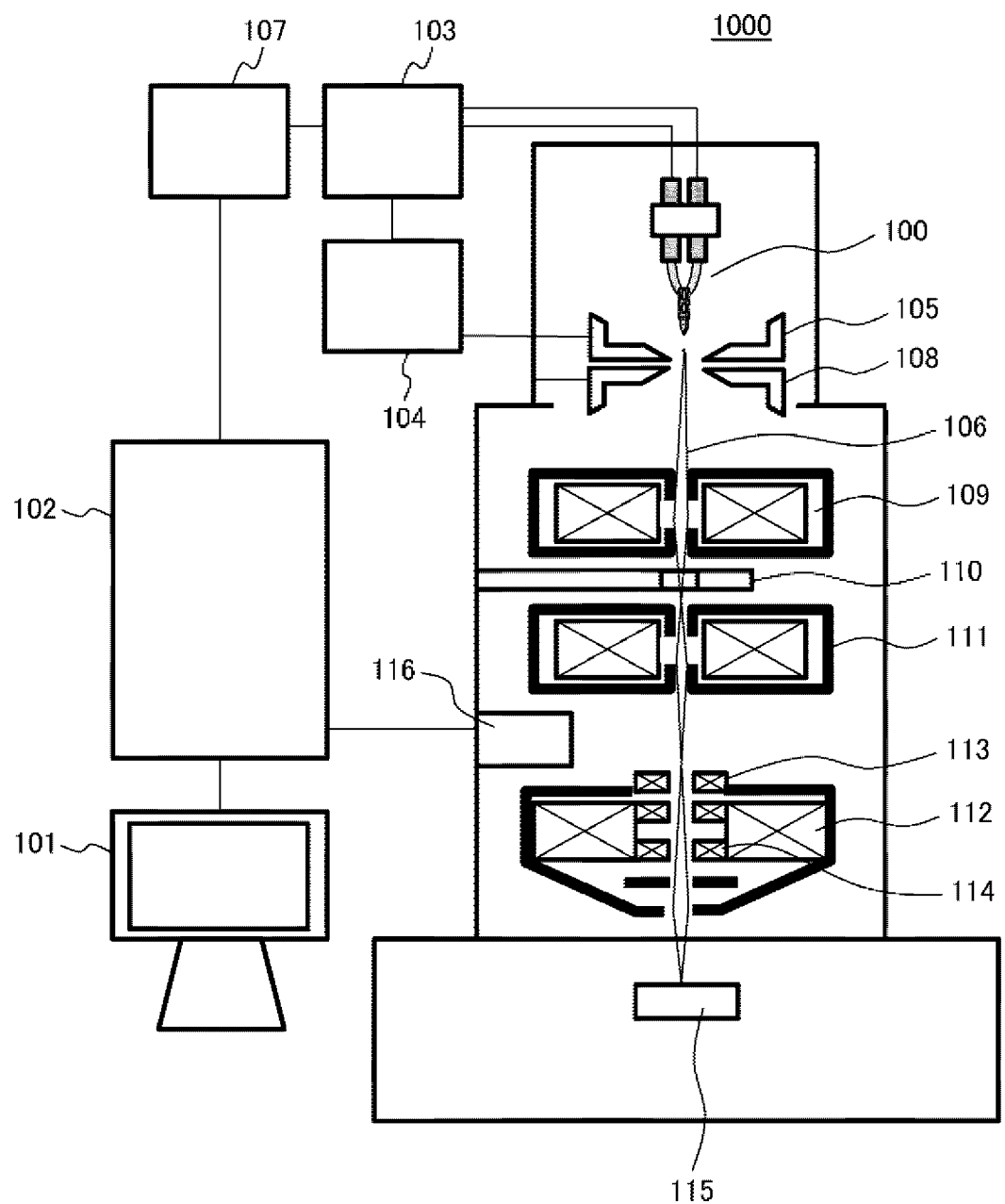

ELECTRON SOURCE, METHOD OF MANUFACTURING THE SAME, AND ELECTRON BEAM APPARATUS USING THE SAME

TECHNICAL FIELD

The present invention relates to an electron source of an electron beam apparatus such as an electron microscope, a method of manufacturing the electron source, and an electron beam apparatus using the electron source.

BACKGROUND ART

Electron microscopes have a spatial resolution exceeding an optical limit and can execute observation and composition analysis of fine structures in the order of nm to pm. Therefore, electron microscopes are widely used in engineering fields such as materials, physics, medicine, biology, electricity, or mechanics. Examples of the electron microscopes include a scanning electron microscope (SEM) as an apparatus that can simply observe a sample surface.

Examples of an electron source used in the electron beam apparatus such as an electron microscope include a thermionic electron source (thermionic emitter (TE)), a field emission electron source (field emitter (FE)), and a Schottky emission electron source (Schottky emitter (SE)).

(a) to (c) of FIG. 1 are energy diagrams showing an operation principle of each of the electron sources.

The thermionic electron source (TE) shown in (a) of FIG. 1 heats a filament of tungsten (W) processed into a hairpin shape to about 2500° C. and causes electrons thermally excited in solid W to cross an energy barrier having a work function Φ (4.3 to 4.5 eV) of W such that the electrons e are extracted in a vacuum. Since the electron source is usually heated, there is no contamination on the surface of the electron source by gas adsorption, and a stable electron beam is extracted with a low current fluctuation. On the other hand, an energy full width at half maximum $\Delta E_{TE}$ of emitted electrons is wide at 3 to 4 eV, an electron emission area is wide, and a brightness B (amount of emission current per unit area or per unit solid angle) is low at about $10^5$ A/cm²sr (a value at an acceleration voltage of 20 kV; hereinafter, the same is applied).

Therefore, a thermionic electron source of hexaboride, such as $LaB_6$, having a work function Φ of 2.6 eV that is lower than that of W is used. Since the $LaB_6$ thermionic electron source has a low work function Φ, the operating temperature can be reduced to about 1400° C. to 1600° C., the energy full width at half maximum $\Delta E_{TE}$ can be suppressed to 2 to 3 eV, and the brightness B can be increased to about $10^6$ A/cm²sr.

JPS60-31059B (PTL 1) and JPS57-141839A (PTL 2) disclose a thermionic electron source that heats hexaboride single crystal to emit thermions. The thermionic electron source has a low spatial resolution because the energy full width at half maximum is wide and chromatic aberration of an electron optical system such as an objective lens of the electron microscope is high. However, the thermionic electron source is used as an electron source for a simple scanning electron microscope that is easy to handle and inexpensive, a transmission electron microscope that is not likely to be affected by chromatic aberration, or the like.

The field emission electron source (FE) shown in (b) of FIG. 1 has good monochromaticity and can emit a high-brightness electron beam. Therefore, the chromatic aberration of the electron optical system can be reduced, and the field emission electron source (FE) is used as an electron source for a scanning electron microscope having a high spatial resolution. In the field emission electron source, the {310} crystal plane of tungsten with a sharp front end is widely used.

By causing an external electric field F to concentrate on the W tip front end, a high electric field is applied such that electrons e in the W tip quantum-mechanically transmit through an effectively thin energy barrier and are emitted in a vacuum. Since the field emission electron source can operate at room temperature, an energy full width at half maximum $\Delta E_{FE}$ of extracted electrons e is narrow at about 0.3 eV. In addition, since a high-density electron beam is emitted from a narrow electron emission surface with an extremely sharp tip front end, the field emission electron source has a characteristic in that the brightness is high at $10^8$ A/cm²sr.

In order to narrow the energy full width at half maximum ΔE to increase the brightness B even in the field emission electron source, a field emission electron source using nanowires of hexaboride such as $LaB_6$ having a low work function Φ is also proposed (for example, JP05660564B (PTL 3)). Since the work function barrier is lower than that of W, electrons can be transmitted with a lower electric field for field emission, and the energy full width at half maximum $\Delta E_{TE}$ can be further reduced.

On the other hand, as a length measurement scanning electron microscope that executes dimension measurement or the like of a semiconductor device, a ZrO/W Schottky emission electron source (SE) shown in (c) of FIG. 1 where zirconium oxide ($ZrO_2$) is applied to a W tip and is diffused to the W{100} crystal plane is used.

The ZrO/W Schottky emission electron source is typically heated to about 1400° C. to 1500° C., and ZrO thermally diffused to the W tip front end decreases the work function Φ of the {100} plane of the W tip to about 2.8 to 2.9 eV. Due to the Schottky effect caused by the external electric field F applied to the tip front end and mirror image potential, thermions cross the energy barrier of the decreased work function Φ and are emitted. The Schottky emission electron source stably extracts a higher current density than the field emission electron source. However, since the operating temperature is high, the energy full width at half maximum $\Delta E_{SE}$ is high at about 0.6 to 1 eV.

The present inventors developed and disclosed a cold field emission electron source (cold field emitter (CFE)) where a {310} crystal plane of $CeB_6$ having a low work function is formed for field emission at room temperature by using a hexaboride single crystal such as $CeB_6$ prepared using a floating zone method or the like, shaping the front end thereof into a hemispherical shape through electrolytic polishing, field evaporation, or the like, and heating the front end at 700° C. to 1400° C. (WO2018/070010A (PTL 4)).

The size of the hexaboride single crystal prepared using a floating zone method or the like is about 0.1 mm to 1 mm, and thus this hexaboride single crystal is advantageous in that it can be assembled into an electron source manually or mechanically to produce the electron source more inexpensively and simply with higher yield than the electron source using the nanowires disclosed in PTL 3 where the diameter is several tens to several hundreds of nanometers.

Regarding the field emission electron source of the hexaboride single crystal, as compared to the field emission electron source of W in the related art, the monochromaticity is higher, and the angular current density can be improved such that a ratio $J_Ω/It$ of an angular current density $J_Ω$ (μA/sr) to a total current It is 6 to 13 or more. Due to this invention, chromatic aberration of a scanning electron microscope at a particularly low acceleration voltage can be improved, and the spatial resolution for observation of a top surface of a sample or for observation of a light element material such as a carbon compound can be increased.

CITATION LIST

Patent Literature

PTL 1: JPS60-31059B
PTL 2: JPS57-141839A
PTL 3: JP05660564B
PTL 4: WO2018/070010A

SUMMARY OF INVENTION

Technical Problem

The field emission electron source has good monochromaticity of emitted electron and can reduce chromatic aberration of an electron optical system such as an objective lens. Therefore, the field emission electron source is suitable for a scanning electron microscope having a high spatial resolution. In particular, when the {310} crystal plane of $CeB_6$ having a low work function is used as in the invention of PTL 4, the monochromaticity is further improved, which is desirable.

However, in the field emission electron source, since the operating temperature is low, residual gas or the like in the electron beam apparatus is likely to be adsorbed on the electron emission surface, and there is a problem in that the stability of emission current deteriorates. In particular, the field emission electron source of hexaboride such as $CeB_6$ having a lower work function than W is more strongly affected by a change in work function caused by gas adsorption and desorption. In particular, it is also known that the crystal surface of the hexaboride single crystal binds to residual oxygen such that the work function increases significantly.

Therefore, an ultrahigh vacuum of about $10^{-9}$ Pa or less is required for an electron gun on which the electron source is mounted. In addition, unless a special method such as regular heating or preventing gas adsorption is used, the field emission electron source of hexaboride is not suitable for length measurement or the like of a semiconductor device where long term stability of several months is required.

An object of the present invention is to solve the above-described problems in the related art and to provide: an electron source of hexaboride single crystal where monochromaticity and long term stability of emission current are achieved at the same time using a method of not only using a stable electron beam emitted from a local region of an electron emission surface that is not likely to be affected by gas adsorption of hexaboride single crystal and is stable in desired shape and time change but also suppressing incorporation of an unstable electron beam emitted from a region other than the emission surface; and an electron beam apparatus such as an electron microscope that can be used for various applications where high resolution and long term stability are required.

Solution to Problem

In order to achieve the above-described object, according to the present invention, there is provided an electron source including a tip of a hexaboride single crystal with a <100> axis, in which a top facet of a {100} plane that is surrounded by side facets including at least four {n11} planes having a high work function and at least four {n10} planes having a low work function where n represents an integer of 1, 2, or 3 is formed at a front end of the tip of the hexaboride single crystal, and a total area of the side facets of the {n11} planes is more than a total area of the side facets of the {n10} planes.

In addition, in order to achieve the above-described object, according to the present invention, there is provided a method of manufacturing an electron source including a tip of a hexaboride single crystal with <100> orientation, the method including: electrolytically polishing a front end portion of the tip of the hexaboride single crystal to form the front end portion of the tip of the hexaboride single crystal in a conical shape; and heating the tip of the hexaboride single crystal where the front end portion is formed in the conical shape and concurrently applying a voltage having positive polarity with respect to the tip of the hexaboride single crystal such that a top facet of a {100} plane that is surrounded by side facets including at least four {n10} planes and at least four {n10} planes where n represents an integer of 1, 2, or 3 is formed on the front end portion of the tip of the hexaboride single crystal that is formed in the conical shape, in which a total area of the side facets of the {n11} planes is more than a total area of the side facets of the {n10} planes.

Further, in order to achieve the above-described object, according to the present invention, there is provided an electron beam apparatus including: an electron source; a sample stage on which a sample is mounted; and an electron optical system that focuses electrons emitted from the electron source into a beam shape and irradiates the sample on the sample stage with the focused beam, in which the electron source includes a tip of a hexaboride single crystal with a <100> axis, a top facet of a {100} plane that is surrounded by side facets including at least four {n11} planes and at least four {n10} planes where n represents an integer of 1, 2, or 3 is formed at a front end of the tip of the hexaboride single crystal, and a total area of the side facets of the {n11} planes is more than a total area of the side facets of the {n10} planes.

Advantageous Effects of Invention

According to the present invention, it is possible to provide: a new electron source where monochromaticity and long term stability of emission current are achieved at the same time; and an electron beam apparatus such as an electron microscope that includes the electron source and can be used for various applications where high resolution and long term stability are required.

BRIEF DESCRIPTION OF DRAWINGS

FIG. 2 is a perspective view showing a crystal structure (unit lattice) of a hexaboride single crystal used in the electron source according to Embodiment 1.

FIG. 3 is a schematic diagram showing a state where a tip of a quadrangular prism is cut along a [100] crystal axis from the hexaboride single crystal according to Embodiment 1 that is grown along the [100] crystal axis.

FIG. 4 is a perspective view showing a state where a metal tube according to Embodiment 1 is mounted on an assembly stage of the tip of the hexaboride single crystal.

FIG. 5 is a perspective view showing a positional relationship between the metal tube that is mounted on the assembly stage of the hexaboride tip, a tool for pressure welding, and a stereoscopic microscope to describe a joining method of the metal tube according to Embodiment 1 and the tip of the hexaboride single crystal.

FIGS. 6A to 6C are diagrams showing a structure where the metal tube according to Embodiment 1 and the tip of the hexaboride single crystal are joined, in which FIG. 6A is a plan view, FIG. 6B is a perspective view, and FIG. 6C is a front cross-sectional view.

FIG. 7 is a front view showing a structure as an original form of the electron source to describe the assembly structure of the electron source according to Embodiment 1.

FIGS. 8A and 8B are diagrams showing an alignment jig during the assembly of the electron source according to Embodiment 1, in which FIG. 8A is a perspective view showing the metal tube, a filament, and an alignment jig for aligning positions thereof and FIG. 8B is a perspective view showing the metal tube to which the filament is spot-welded, a stem, and an alignment jig for aligning positions thereof.

FIGS. 9A to 9C are diagrams showing another example of the structure where the metal tube according to Embodiment 1 and the tip of the hexaboride single crystal are joined, in which FIG. 9A is a plan view, FIG. 9B is a perspective view, and FIG. 9C is a front cross-sectional view.

FIG. 10 is a front cross-sectional view showing a state where the electron source structure is dipped in an electrolytic polishing solution to describe a step of sharpening a tip front end of the electron source according to Embodiment 1 by electrolytic polishing.

FIG. 11 is a front cross-sectional view showing the hexaboride tip and the electrolytic polishing solution to describe a principle of the electrolytic polishing of the tip front end of the electron source according to Embodiment 1.

FIGS. 12A to 12C are SEM images obtained by observing a shape in which a tip front end of an electron source is processed by electrolytic polishing in the related art, in which FIG. 12A is a SEM image showing a front end portion of the tip, FIG. 12B is an enlarged SEM image showing the vicinity of a top of the front end of the tip, and FIG. 12C is a SEM image showing a portion surrounded by a circle 401 of FIG. 12B when seen from right above (central axis direction of the tip).

FIGS. 13A to 13C are SEM images obtained by observing a crystal plane structure of a tip front end of an electron source prepared using a manufacturing method according to Embodiment 1, in which FIG. 13A is a SEM image showing a front end portion of the tip, FIG. 13B is an enlarged SEM image showing the vicinity of a top of the front end of the tip, and FIG. 13C is a SEM image showing a portion surrounded by a circle 401 of FIG. 13B when seen from right above (central axis direction of the tip).

FIG. 14 is a schematic diagram showing a tip front end structure of the electron source of the hexaboride single crystal according to Embodiment 1.

FIG. 15 is a front view showing the electron source of the hexaboride single crystal according to Embodiment 1.

FIG. 16 is a diagram showing a process condition range of the manufacturing method according to Embodiment 1.

FIGS. 17A and 17B are field emission microscope observation images of field electron emission at room temperature in the hexaboride single crystal electron source, in which FIG. 17A is hexaboride single crystal electron source in the related art and FIG. 17B is the hexaboride single crystal electron source prepared in Embodiment 1.

FIG. 18 is a graph showing a measurement result of a ratio between an angular current density and a total current in each of the hexaboride single crystal electron source in the related art and the hexaboride single crystal electron source prepared in Embodiment 1.

FIG. 19 is a graph showing a measurement result of an energy full width at half maximum relative to an angular current density of emitted electrons in each of the field emission electron source using the tip of the hexaboride single crystal with the {100} plane according to Embodiment 1, a hexaboride field emission electron source using a {310} plane in the related art, and a field emission electron source of W using the same {310} plane in the related art.

FIGS. 20A and 20B are graphs showing stability of a cold cathode field emission current at which the electron source using the tip of the hexaboride single crystal prepared in Embodiment 1 operates at room temperature, in which FIG. 20A shows a fluctuation for 0.1 hours and FIG. 20B shows a fluctuation for 8 hours.

FIGS. 21A and 21B are graphs showing stability of a thermal field emission current at which the electron source using the tip of the hexaboride single crystal prepared in Embodiment 1 is heated to 160° C. and operates, in which FIG. 21A shows a fluctuation for 0.1 hours and FIG. 21B shows a fluctuation for 8 hours.

FIG. 22 a graph showing a measurement result of an energy full width at half maximum relative to an angular current density in each of a Schottky electron source of a hexaboride single crystal according to Embodiment 2 and a Zr-O/W Schottky electron source.

FIGS. 23A and 23B are graphs showing short-term stability of emission current during operation in a Schottky mode according to Embodiment 2, in which FIG. 23A is a graph showing a case of a Schottky electron source using the tip of the hexaboride single crystal prepared in Embodiment 1 where the front end portion is formed on the (100) plane and FIG. 23B is a graph showing a case of a Schottky electron source using a tip of a hexaboride single crystal prepared in the related art where a front end portion is formed on a (310) plane.

FIG. 24 is a schematic cross-sectional view showing an electron beam apparatus (a scanning electron microscope where an electron source using a tip of a hexaboride single crystal is mounted) according to Embodiment 3.

DESCRIPTION OF EMBODIMENTS

Figure 1A:
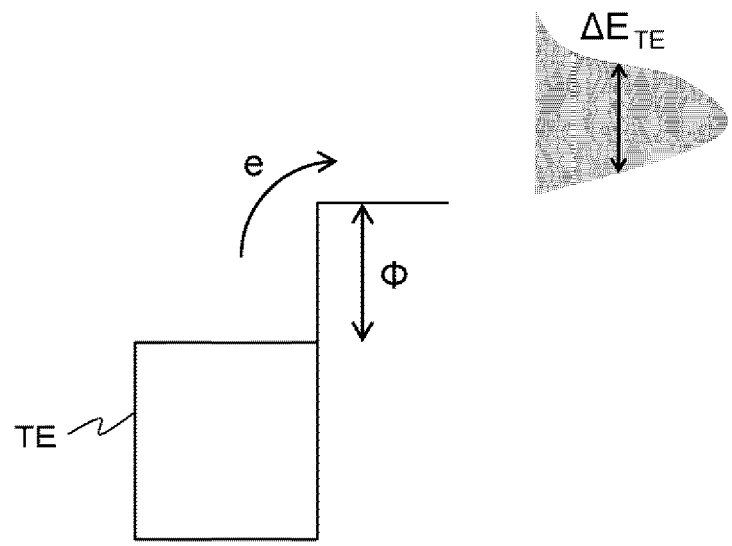
FIGS. 1A to 1C are energy diagrams showing operation principles of various electron sources used in an electron beam apparatus such as an electron microscope.
Figure 1B:
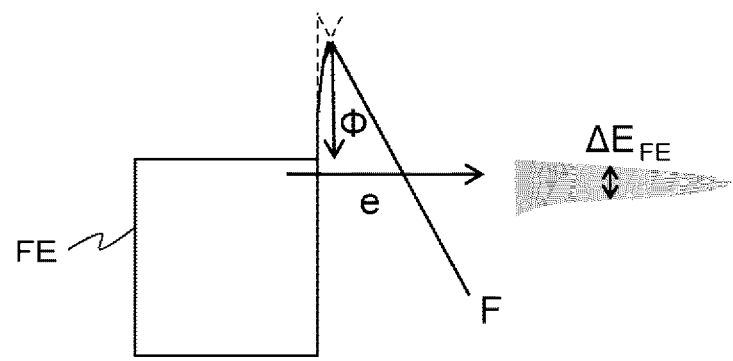
Figure 1C:
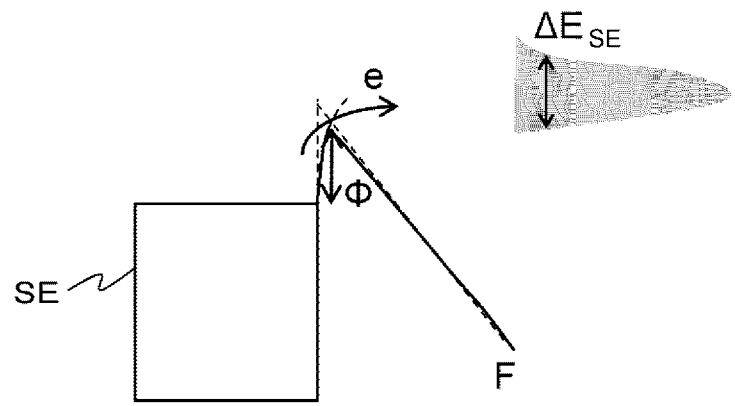

In the following description, a crystal plane or a crystal orientation is defined by the Miller indices, a plane is represented by ( ) and a plane group equivalent to the plane is represented by { }. A crystal axis direction is represented by [ ], and an axis direction equivalent to the crystal axis direction is represented by < >.

As a result of thorough investigation, the present inventors found that, by using a single crystal where a <100> crystal axis is an optical axis for a {100} crystal plane of hexaboride and using a method described below, a stable electron emission surface where a fine flat surface is formed and facets with 4-fold symmetry can be constructed can be formed, and monochromaticity and current stability can be achieved at the same time.

Specifically, it was found that it is effective to use, as a probe, an electron beam from a top facet of a {100} plane in a tip of a hexaboride single crystal with a <100> axis, in which the top facet of the {100} plane that is surrounded by side facets including at least four {n11} planes having a high work function and at least four {n10} planes having a low work function where n represents an integer of 1, 2, or 3 is formed at a front end of the tip of the hexaboride single crystal, and a total area of the side facets of the {n11} planes is more than a total area of the side facets of the {n10} planes. Hereinafter, the reason for this will be described.

As disclosed in PTL 4 by the present inventors, in the hexaboride single crystal, when the tip front end is shaped into a spherical shape by field evaporation and subsequently is heated at 700° C. to 1400° C. for 2 minutes to several days, the {310} planes with 4-fold symmetry centering on the {100} plane grow, and the work function thereof is low at 2.46 eV. In addition, the {310} plane is a portion that has a low work function and is sharper than a curvature of the entire surface of the tip front end. As a result, locally, the field concentration degree increases, and electrons are likely to be emitted.

Therefore, by using an electron beam from the {310} plane as a probe, a field emission electron source where an energy full width at half maximum $\Delta E_{FE}$ is narrow and a ratio $J_\Omega/It$ of an angular current density $J_\Omega$ (µA/sr) to a total current It is high at 6 to 13 or more can be realized.

However, as the work function becomes lower and the field concentration degree becomes higher, sensitivity to a change in work function caused by gas adsorption or desorption increases. Therefore, when an electron gun is used in an environment having a low vacuum degree or when the amount of gas desorbed by electron beam stimulation increases due to an electron beam that extracts a high current and collides against an extraction electrode, there is a problem in that the probe current becomes unstable.

On the other hand, as a result of the investigation, the present inventors found that, when a facet of a {100} plane is formed at the top of a tip of a hexaboride single crystal with a <100> axis as in the thermionic electron source of the hexaboride single crystal disclosed in PTL 1 or 2 and field emitted electrons from the {100} plane are used as a probe, the stability of emission current is higher than that of field emitted electrons from the {310} plane.

For example, this is mainly because: the {100} plane has a slightly higher work function than the {310} plane; the {100} plane has a higher atomic plane density than the {310} plane such that atomic vibration is suppressed; a flat facet having a large area can be easily formed by heating such that the field concentration degree decreases; and a local change in work function caused by gas adsorption and desorption during field electron emission is averaged in a plane of the large facet such that the entire fluctuation decreases. Therefore, when the facet of the {100} plane is formed in the front end of the hexaboride single crystal tip with the <100> axis and an electron beam emitted from the {100} plane is used as a probe, the current stability can be improved.

However, when the work function increases such that the field concentration degree decreases, conversely, the {100} plane is less likely to emit electrons than the {310} plane, and emission of electrons from the {310} planes formed around the {100} plane is unnecessary. Therefore, there is a problem in that the ratio of the angular current density $J_\Omega$ (µA/sr) to the total current It is significantly low at lower than 1.

When this ratio is excessively low, a total current It required to obtain a necessary angular current density $J_\Omega$ increases, an emission current in a region other than an optical axis corresponding to an extraction electrode or the like of an electron gun increases, and the amount of gas desorbed by electron beam stimulation increases such that the vacuum degree decreases. As a result, gas adsorption and desorption on the surface of the electron source increase, and the stability of emission current deteriorates.

In order to solve this problem, it is necessary to reduce electron emission from the periphery other than the top facet of the {100} plane. To that end, it is effective that the side facets of the {n11} planes such as a {111} plane having a higher work function than the {100} plane are formed in a large area around the {100} plane and the side facets of the {n10} planes such as a {310} plane, a {210} plane, or a {110} plane having a lower work function than the {100} plane are formed in a small area.

However, when the facet of the {100} plane is formed by heating the tip of the hexaboride single crystal with the <100> axis that is sharpened by electrolytic polishing or field evaporation, a (110) plane having a lower work function than the {100} plane grows to be larger than the {111} plane having a high work function in the side of the tip front end as shown in the example of the thermionic electron source of PTL 1. Therefore, a method of cutting the entire side such that the {111} planes are formed by electric discharge machining as disclosed in PTL 2 is proposed.

However, it is significantly difficult to apply this manufacturing method to processing of a field emission electron source or an Schottky electron source where the front end curvature radius is several tens to several hundreds of nanometers. In addition, in this processed shape, ridges between the four {111} planes are sharp such that an electric field is likely to concentrate thereon, and unnecessary field emission in a region other than an optical axis increases. Therefore, a stronger electric field than that of the thermionic electron source acts, and it is difficult to apply the manufacturing method to a field emission electron source or a Schottky electron source that emits electrons.

By developing a new manufacturing method according to the present invention in consideration of the above-described circumstances, it is possible to prepare an electron source tip of a hexaboride single crystal with a <100> axis, in which a top facet of a {100} plane that is surrounded by side facets including at least four {n11} planes having a high work function and at least four {n10} planes having a low work function where n represents an integer of 1, 2, or 3 is formed at a front end of the tip of the hexaboride single crystal, and a total area of the side facets of the {n11} planes having a higher work function is more than a total area of the side facets of the {n10} planes having a low work function. As a result, an electron source where the monochromaticity is good, the stability of emission current is high, and the ratio $J_\Omega/It$ of the angular current density $J_\Omega$ (µA/sr) to the total current It is high can be realized.

Hereinafter, the present invention will be described based on an embodiment with reference to the drawings. An electron beam apparatus according to an embodiment will be described using a scanning electron microscope (SEM) as an example. However, the present invention is not limited to this example and can also be applied to a transmission electron microscope (TEM), a scanning transmission electron microscope (STEM), an electron beam exposure apparatus, or an electron beam 3D printer, or an electron beam apparatus including an X-ray tube. In the following drawings, the scale of each of configurations is appropriately changed in order to easily understand the configuration of the present invention.

Embodiment 1

In Embodiment 1, a structure of a field emission electron source (hereinafter, also simply referred to as the electron source) of a hexaboride single crystal according to the present invention and a method of manufacturing the same will be described using FIGS. 2 to 20.

First, a rare earth hexaboride single crystal is used as a material of the electron source. Specifically, La, Ce, Pr, Nd, Sm, Eu, Gd, or the like as a lanthanide element can be used, and each of the materials is represented by a chemical formula such as $LaB_6$, $CeB_6$, $PrB_6$, $NdB_6$, $SmB_6$, $EuB_6$, or $GdB_6$. FIG. 2 is a schematic diagram of a unit lattice 200 of the hexaboride single crystal.

The unit lattice 200 has a crystal structure where a block of six boron atoms 2 are positioned at the body-center of a simple cubic lattice of a metal atom 1. In general, this material has a high melting point, a low vapor pressure, a high hardness, a strong resistance to ion bombardment, and a lower work function than W, and thus is suitable as a material of the electron source.

Among these, in Ce and a lanthanide Pr, Nd, Sm, Eu, Gd, or the like having a higher atomic weight than Ce, f electrons having strong energy localization and a high state density just below the Fermi level are present, and the electron density for supplying the emission current is high. Therefore, Ce and the lanthanide Pr, Nd, Sm, Eu, Gd, or the like are suitable as a material of the hexaboride single crystal for preparing a field emission electron source or a Schottky electron source. In the embodiment, an example using a hexaboride single crystal of $CeB_6$ is described.

Using the hexaboride, as shown in FIG. 3, a large single crystal 3 having a diameter of several millimeters and having a length of several tens of millimeters that is grown in a [100] crystal axis direction perpendicular to a (100) plane as a habit plane where crystal preferentially grows can be formed, for example, by melt (liquid) crystal growth using a floating zone method or the like.

This single crystal 3 is cut into a tip 4 having a length of several millimeters in a prism shape having one side length of several micrometers or a cylinder shape having a diameter of several hundreds of micrometers, and the (100) plane is used as an electron emission surface. In the embodiment, a quadrangular prism having one side length of 200 μm and a length of 5 mm or a cylinder having a diameter of 280 μm and a length of 5 mm is used.

The crystal structure of the hexaboride single crystal is the simple cubic lattice as shown in FIG. 2, in which the (100) plane is equivalent to a (010) plane or a (001) plane, the [100] crystal axis is equivalent to a [010] crystal axis, a [001] crystal axis, or the like, and the effect is the same even when any of the planes or any of the axis directions is used. Therefore, in the following description, {100} or the like is used as the equivalent plane group, and <100> or the like is used as the equivalent axis group.

Next, a joining method of holding the tip 4 of the hexaboride single crystal and attaching a filament for heating will be described. The electron source according to the embodiment has a structure in which the tip of the hexaboride single crystal is arranged inside a metal tube such as tantalum or niobium.

In the outer periphery of the metal tube, a plurality of recess parts are provided from at least two axis directions to surround a central axis, and a bottom portion of each of the plurality of recess parts is brought into contact with the outer periphery of the tip of the hexaboride single crystal arranged inside the metal tube. As a result, the structure is rigid and has joining reliability such that the tip of the hexaboride single crystal does not peel off even when heated at a high temperature.

Further, a gap between the metal tube and the tip of the hexaboride single crystal is filled with a paste of a mixture of boron carbide nanoparticles having an average particle size of 0.01 to 0.1 μm and a carbon resin, and this paste is cured and further carbonized for joining having high heat resistance. Hereinafter, the details will be described.

As a material of the metal tube used for joining to the tip 4 of the hexaboride single crystal, a high melting point metal such as tantalum or niobium that is rich in ductility and with which a fine metal tube can be easily formed by drawing and a recess part described below can be easily processed is suitable. In the embodiment, for example, using tantalum, a fine metal tube 11 having an outer diameter of ϕ 500 μm, an inner diameter of ϕ 320 μm, a wall thickness of 90 μm, and a length of 5 mm is prepared.

Next, a joining method of the tip 4 of the hexaboride single crystal using the above-described metal tube 11 will be described. First, as shown in FIG. 4, by using a pedestal 13 where a guide pin 12 having a diameter of 300 μm that is less than the inner diameter of the metal tube 11 and a length of 1 to 3 mm stands vertically, the guide pin 12 is inserted into the metal tube 11, and the metal tube 11 stands orthogonally to the pedestal 13. Next, the metal tube 11 is filled with a paste 14 from above, the paste 14 being obtained by mixing nanoparticles of boron carbide $B_4C$ or the like having an average particle size of 0.01 to 0.1 μm and a carbon resin such as a furan resin with each other. Here, nanoparticles having an average particle size of 0.05 μm are used.

Further, the tip 4 of the hexaboride single crystal is inserted into the metal tube 11 from above. By using the guide pin 12, a length h in which the tip 4 of the hexaboride single crystal protrudes from the metal tube 11 can be controlled. In the embodiment, as described below, a single front end of the tip 4 of the hexaboride single crystal is polished by electrolytic polishing. Therefore, the protrusion length h is set to 2 to 3 mm.

Next, as shown in FIG. 5, the tip 4 of the hexaboride single crystal and the metal tube 11 are pressure-welded using a special tool developed by the present inventors from two axes and four directions orthogonal to each other in a plane perpendicular to the vertical direction of the tip 4. In order to simplify the description, FIG. 5 shows only a portion of a blade 15 of the tool for pressure welding. At a front end of the blade 15 of the tool for pressure welding, a pair of protrusions 150 for forming the recess parts in the metal tube 11 are vertically provided. The blade 15 of the tool for pressure welding is moved close to the metal tube 11 with uniform stroke from the two axes and the four directions, and the metal tube 11 is crushed from the outer periphery using the protrusions 150. As a result, a plurality of recess parts 17 shown in FIG. 6(c) are formed in the metal tube 11.

During the operation, a positional relationship between the metal tube 11 and the tip 4 of the hexaboride single crystal is checked with a stereoscopic microscope 16, and a rotation axis of the tip 4 of the hexaboride single crystal is appropriately adjusted such that each of the side surfaces of the quadrangular prism tip 4 of the hexaboride single crystal matches with the stroke direction of the blade 15 of the tool. As a result, the plurality of recess parts 17 are formed to surround the central axis from the outer periphery of the metal tube 11, the bottom portion of each of the recess parts 17 is crushed and comes into contact with the outer peripheral surface of the tip 4 of the hexaboride single crystal, and thus the tip 4 of the hexaboride single crystal can be automatically fixed to the central axis of the metal tube 11.

Figure 6A:
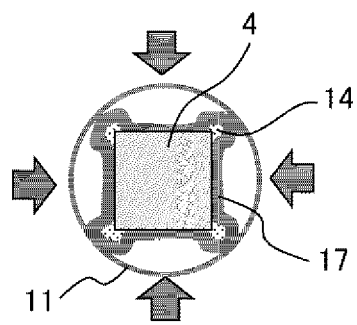
Figures 6B, 6C:
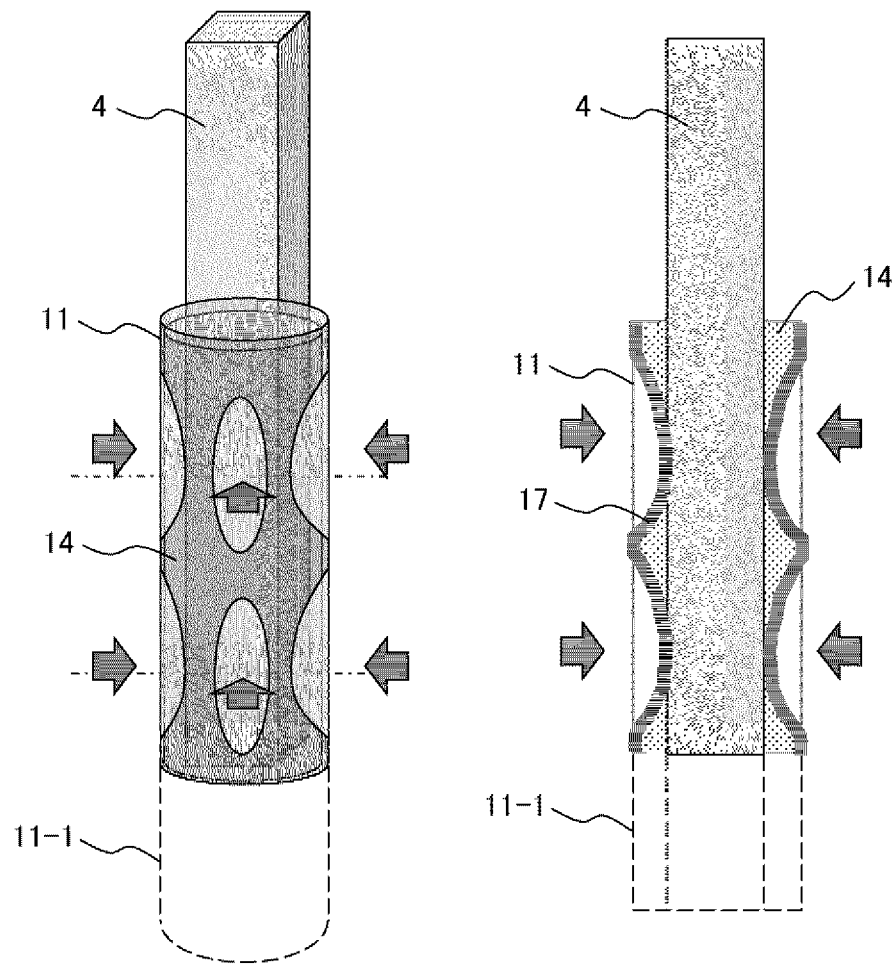

FIG. 6 is a schematic diagram showing the tip 4 of the hexaboride single crystal and the metal tube 11 joined using the method according to the embodiment. In FIG. 6, (a) is a plan view showing the joined portion when seen from the front end side of the tip 4, (b) is a perspective view showing the tip 4, and (c) is a cross-sectional view in the vertical direction of the tip 4.

By using this joining method, the metal tube 11 and the tip 4 of the hexaboride single crystal can be pressure-welded uniformly from the two axes and the four directions, and mechanically strong joining can be obtained. In addition, the blade 15 is moved to close to the metal tube 11 with uniform stroke from the two axes and the four directions, and the metal tube 11 is crushed from the outer periphery. Therefore, the quadrangular prism tip 4 of the hexaboride single crystal can be automatically aligned to the central axis of the metal tube 11 for joining, and the assembly accuracy is improved. Thus, the axis alignment of the electron source is easy, and the yield is also improved. Further, by joining the upper and lower two positions in the axis direction, the tip 4 can be prevented from being inclined in the joined portion, and an effect of further improving the axis alignment accuracy can be obtained.

In addition, during the pressure welding, the paste 14 obtained by mixing the nanoparticles of boron carbide $B_4C$ and the carbon resin such as a furan resin is flexibly deformed, and compactly fills the gap between the deformed metal tube 11 and the tip 4 of the hexaboride single crystal. As the paste 14, the nanoparticle having a small average particle size of 0.1 μm or less are used. Therefore, during the pressure welding, the tip 4 of the hexaboride single crystal is not damaged and fractured, and the yield in the pressure welding step can be improved. The reason why the average particle size of the nanoparticles is 0.01 μm or more is that, when the average particle size is excessively small, the apparent volume of the $B_4C$ powder increases such that it is difficult to mix the $B_4C$ powder in the paste, it is difficult to manufacture the nanoparticles, and the cost increases.

After pressure-welding the metal tube 11 to the tip 4 of the hexaboride single crystal, in the metal tube 11, a portion 11-1 indicated by a dotted line where the guide pin 12 is inserted is unnecessary. Therefore, after removing the metal tube 11 from the guide pin 12, the portion 11-1 is cut using a cutter to reduce the heat capacity of the metal tube 11. Next, after curing the paste 14 by heating in the atmosphere, the paste 14 is heated at a high temperature of 1000° C. or higher in a vacuum for several hours to carbonize the paste 14. As a result, gas desorbed from the paste 14 can be reduced, and a reaction barrier layer that prevents a reaction at a high temperature between the metal tube 11 such as a tantalum and the tip 4 of the hexaboride single crystal can be formed.

Next, as shown in FIG. 7, a filament 18 such as tungsten is directly spot-welded to the metal tube 11 to which the tip 4 of the hexaboride single crystal is joined. Further, opposite ends of the filament 18 are spot-welded to a pair of electrodes 20 fixed to a stem 19, and a structure 1001 as an original form of the electron source is formed. The structure 1001 is formed by joining the metals, and thus stronger joining can be obtained by spot welding.

Figure 8A:
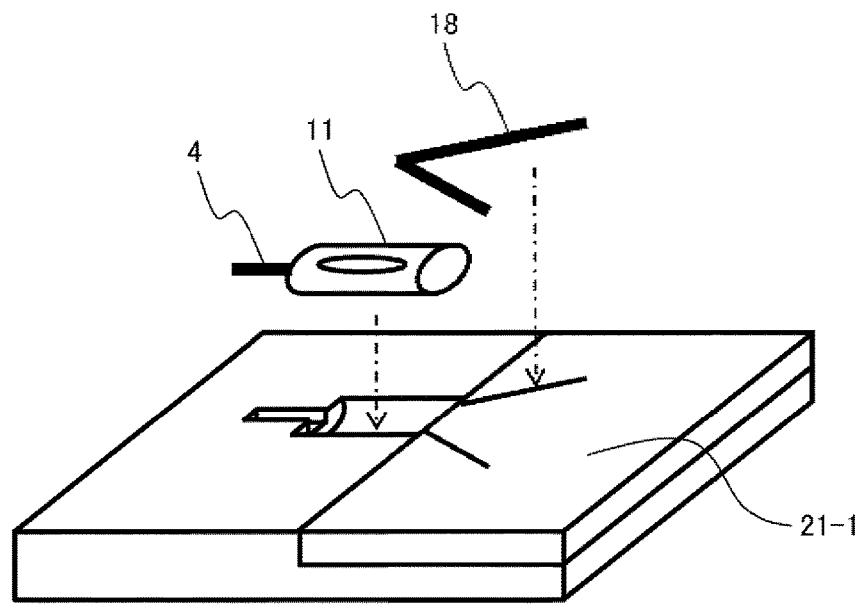
Figure 8B:
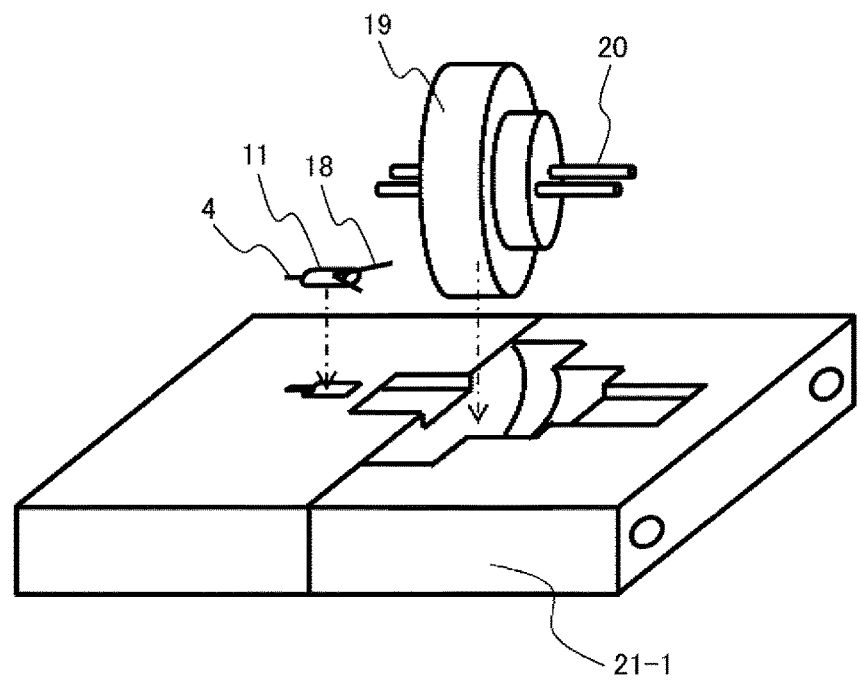

A specific example of the welding step for forming the structure 1001 will be described using FIG. 8. When the filament 18 such as tungsten is directly spot-welded to the metal tube 11 to which the tip 4 of the hexaboride single crystal is joined, an alignment jig 21 shown in (a) of FIG. 8 is used. First, the filament 18 such as tungsten is accurately aligned to the metal tube 11 using an alignment jig 21-1, and the metal tube 11 and the filament 18 are spot-welded.

Next, as shown in FIG. 8 (b), the metal tube 11 to which the filament 18 is spot-welded and the stem 19 are accurately aligned using an alignment jig 21-2, the filament 18 and the pair of electrodes 20 fixed to the stem 19 are spot-welded to form the structure 1001. This way, by using the alignment jigs 21-1 and 21-2, in the assembly stage of the structure 1001, the metal tube 11, the central axis of the tip 4 of the hexaboride single crystal, and the center of the pair of electrodes 20 fixed to the stem 19 are aligned. Therefore, the axis alignment of the structure 1001 can be performed with high accuracy.

Figure 9A:
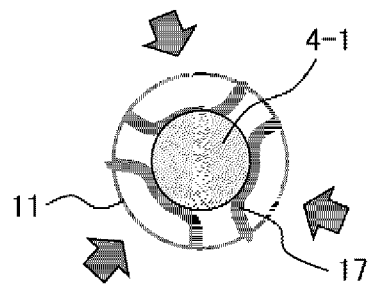
Figure 9B:
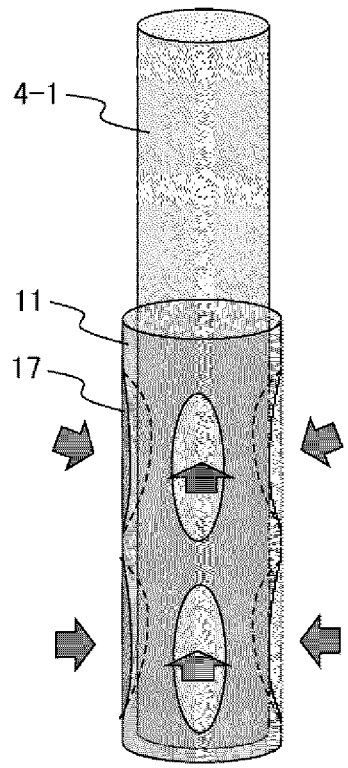
Figure 9C:
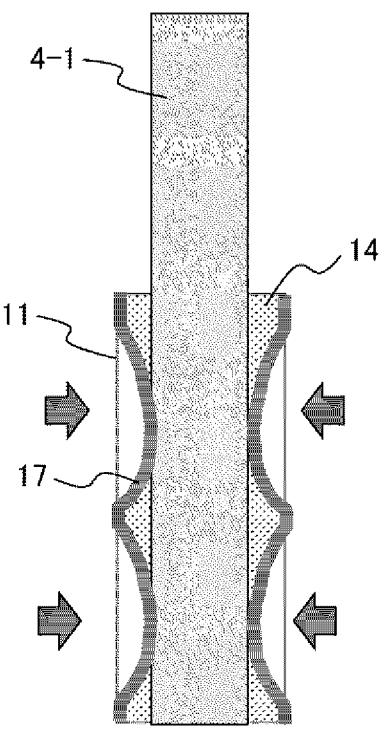

In the above-described embodiment, the tip 4 of the hexaboride single crystal cut into a quadrangular prism shape is used as the component of the structure 1001. The tip 4 of the hexaboride single crystal may be processed into a cylinder shape. FIG. 9 shows an example where a cylinder tip 4-1 of a hexaboride single crystal is used. When the cylinder tip 4-1 of the hexaboride single crystal and the metal tube 11 are joined, the tip 4-1 and the metal tube 11 may be pressure-welded using a special tool developed in the embodiment from at least three axes and three directions at regular intervals in a plane perpendicular to the vertical direction of the tip 4-1 of the hexaboride single crystal.

In FIG. 9, (a) is a plan view showing the joined portion when seen from the front end side of the tip 4-1, (b) is a perspective view showing the tip 4-1, and (c) is a cross-sectional view in the vertical direction of the tip 4-1. (b) and (c) of FIG. 9 show a state where a portion of the metal tube 11 corresponding to the portion 11-1 that is unnecessary after pressure-welding to the tip 4 of the hexaboride single crystal described above with reference to FIG. 6 is cut.

In addition, of course, as in the case of the quadrangular prism tip 4 of the hexaboride single crystal described above with reference to FIGS. 5 and 6, the metal tube 11 and the cylinder tip 4-1 of the hexaboride single crystal may be pressure-welded from the two axes and the four directions for joining.

Next, in the structure 1001, a front end of a portion of the tip 4 of the hexaboride single crystal protruding from the metal tube 11 is reduced in diameter in a conical shape by electrolytic polishing. During the electrolytic polishing, as shown in FIG. 10, the front end portion of the assembled tip 4 of the hexaboride single crystal is dipped in an electrolytic solution 22 such as nitric acid put into a container 25, and a voltage is applied from an AC or DC power supply 24 to a counter electrode 23 such as platinum that is formed in a ring shape.

When the tip 4 of the hexaboride single crystal is dipped in the electrolytic solution (electrolytic polishing solution) 22 as shown in FIG. 11, meniscus is formed on the liquid level, the polishing rate of a portion on the liquid level is slow, and the polishing rate of a portion in the liquid is fast. As the electrolytic polishing progresses such that the polishing area of the tip 4 of the hexaboride single crystal in the portion dipped in the electrolytic solution 22 is reduced, the electrolytic current is attenuated. When the electric field current is attenuated up to a given level (cutoff current), if power supply 24 is interrupted, a front end portion 40 can be processed into a tapered cone as indicated by a dotted line in FIG. 11.

Figure 12A:
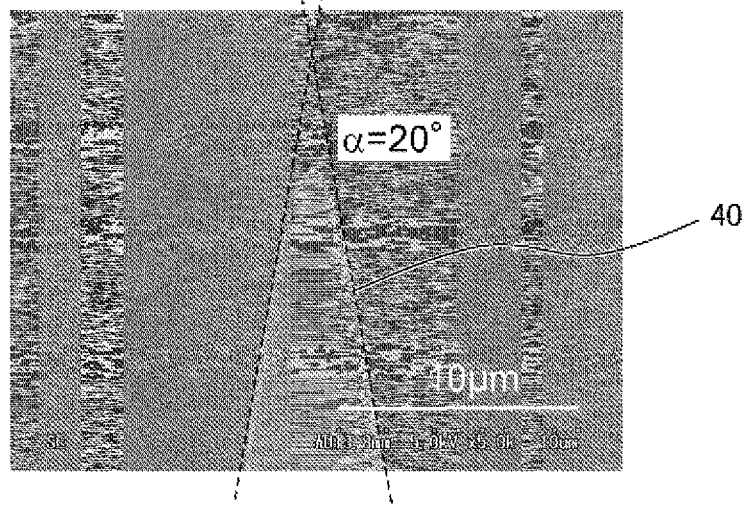
Figure 12B:
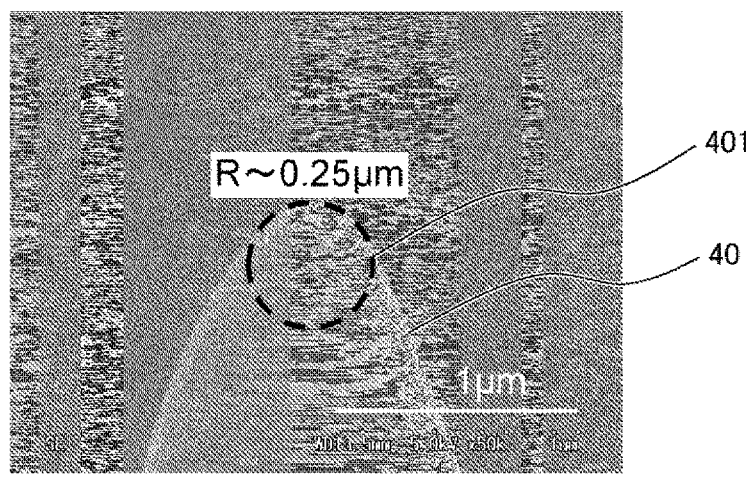
Figure 12C:
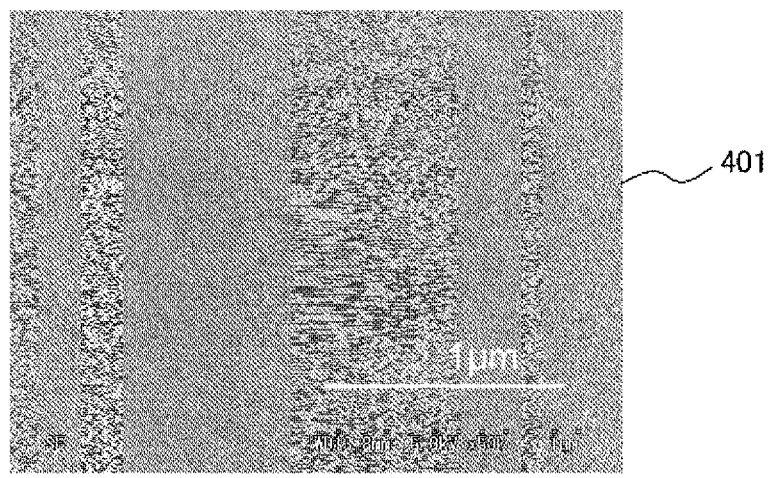

(a) to (c) of FIG. 12 show examples of SEM images showing the vicinity of the front end portion 40 of the processed tip 4 of the hexaboride single crystal. A cone angle α of the front end portion 40 of the tip 4 of which the diameter is reduced by electrolytic polishing shown in (a) of FIG. 12 can be freely controlled depending on the liquid composition, the electrolytic voltage, the cutoff current, and the like during the electrolytic polishing. In the tip 4 of the hexaboride single crystal prepared in the embodiment as shown in FIG. 12(a), the cone angle α in a range of about 10 μm from the front end portion 40 after electrolytic polishing is 20°.

In addition, as shown in FIG. 12(b), the front end portion 40 of the tip 4 is smoothly processed such that the front end curvature radius R is about 0.25 μm. (c) of FIG. 12 shows a SEM image obtained by observing the vicinity 401 of the top surrounded by a circle of a dotted line in the front end portion 40 of the tip 4 in FIG. 12(b) when seen from right above. The vicinity 401 of the top is smoothly processed, and it is difficult to discriminate a boundary of the crystal plane.

This way, for the tip 4 of the hexaboride single crystal where the diameter of the front end portion 40 is reduced by electrolytic polishing, in the embodiment, by forming the crystal plane of the side surface of the front end portion 40 to enter a desired state, the stable electron emission surface can be formed. Hereinafter, a method of forming the crystal plane of the side surface of the front end portion 40 of the tip 4 of the hexaboride single crystal to enter a desired state will be described.

The tip 4 of the hexaboride single crystal that is processed into the shape of the front end portion 40 shown in FIG. 12 by electrolytic polishing is set in a vacuum chamber (not shown) and, through a new manufacturing process developed in the embodiment, is processed into the shape of the front end portion 40 of the tip 4 of the hexaboride single crystal with the <100> axis, in which a top facet of a {100} plane that is surrounded by side facets including at least four {n11} planes having a high work function and at least four {n10} planes having a low work function where n represents an integer of 1, 2, or 3 is formed in the front end portion 40 of the tip 4, and a total area of the side facets of the {n11} planes is more than a total area of the side facets of the {n10} planes.

A characteristic of the manufacturing method according to the embodiment is that the electrolytically polished tip 4 is heated in a vacuum at 1500° C. to 1700° C. and concurrently an electric field having positive polarity of 1 to $4.5 \times 10^9$ V/m is applied to the tip 4.

First, in order to describe the characteristic of the new manufacturing process developed in the embodiment, a method of preparing an field emission electron source and a thermionic electron source that is a hexaboride single crystal electron source in the related art will be described as a comparative example.

As described in PTL 4, in the field emission electron source using the hexaboride single crystal in the related art, a front end portion of a tip that is reduced in diameter in a conical shape by electrolytic polishing is processed into a hemispherical shape by field evaporation and is subsequently heated to form a {310} plane as an electron emission surface. The field evaporation is a method of applying an electric field having positive polarity of several $10 \times 10^9$ V/m to the electron source such that atoms on the front end surface are ionized and gradually stripped.

The field evaporation occurs preferentially in a portion where the field intensity is strong. Therefore, atoms are evaporated in a portion having a sharp surface or a step portion, and the entire surface can be evaporated by spending some time. Eventually, as the field evaporation progresses sufficiently, the front end portion of the tip is processed into a spherical shape where the field intensity is uniform over the entire surface. The field evaporation may be performed in a vacuum. However, by performing field evaporation after introducing imaging gas such as He, Ne, or $H_2$ by about $10^{-3}$ Pa to $10^{-2}$ Pa, the field evaporation can be performed while observing the surface image of the electron source front end. This observation method is called a field ion microscope (FIM).

The imaging gas is ionized at the electron source front end and is radially emitted. A microchannel plate (MCP) is placed on the opposite surface, and the surface image of the electron source front end can be observed with atomic resolution by detecting emitted ions. When thermal vibration of ions occurs during the observation with the FIM, the spatial resolution deteriorates. Therefore, the field evaporation is typically performed at a low temperature of 70 K or lower.

In the field emission electron source, subsequently, the tip of the hexaboride single crystal where the front end is processed into a hemispherical shape is heated at 700° C. to 1400° C. for 2 minutes to several days, electron emission portions of the {310} planes with 4-fold symmetry around the {100} plane are formed, and one of the electron emission portions is used as the electron emission surface.

On the other hand, in the thermionic electron source using the hexaboride single crystal, as described in PTL 1 or the like, the electrolytically polished hexaboride single crystal is heated to about 1400° C. to 1500° C., and the top facet of the {100} plane is formed and used as the electron emission surface. In this case, on the side surface of the tip front end, the {210} plane or the {110} plane grows to be larger than the {111} plane.

On the other hand, characteristics of the method of manufacturing the electron source according to the embodiment are: that the heating temperature of the tip 4 is higher than that of the method of preparing the field emission electron source or the thermionic electron source in the related art described above; and that the field intensity of the electric field having positive polarity applied to the front end portion 40 of the tip 4 is lower than that of the typical field evaporation. Due to these characteristics, the front end structure of the tip 4 of the hexaboride single crystal with the <100> axis formed in the embodiment can be obtained, the tip 4 of the hexaboride single crystal having a structure in which a top facet of a {100} plane that is surrounded by side facets including at least four {n11} planes having a high work function and at least four {n10} planes having a low work function where n represents an integer of 1, 2, or 3 is formed in the front end portion 40 of the tip 4, and a total area of the side facets of the {n11} planes is more than a total area of the side facets of the {n10} planes. Hereinafter, the reason for this will be described.

First, the effect of heating will be described. The tip 4 of the hexaboride single crystal is a high melting point material, and when the tip 4 is heated in a vacuum at 700° C. to 1400° C., in particular, the reconfiguration of the crystal planes of the front end portion 40 of the tip 4 occurs due to atomic migration of the surface. Further, when the tip 4 is heated at 1500° C. or higher, evaporation from the surface gradually progresses such that the crystal structure of the surface collapses. When the tip 4 is heated at 1600° C. or higher, evaporation becomes more significant.

Therefore, the heating at 1500° C. to 1700° C. in the manufacturing method according to the embodiment mainly functions as evaporation, and it is known that, when the tip 4 of the hexaboride single crystal is heated without applying any electric field thereto, the front end portion 40 of the tip 4 is tapered while substantially maintaining a similar shape to the shape prepared by electrolytic polishing. When the tip 4 of the hexaboride single crystal is heated at 1700° C. or higher, evaporation becomes more significant, and it is also difficult to maintain the similar shape to the shape prepared by electrolytic polishing.

Next, the effects of the voltage having positive polarity that is applied to the front end portion 40 of the tip 4 will be described. The effects include two effects. First, the first effect will be described below.

In field evaporation that is performed at a low temperature of about 70 K while observing the FIM, a high electric field of several $10 \times 10^9$ V/m is applied to process the tip front end into a spherical shape. This field evaporation has temperature dependence, and as the temperature increases, field evaporation occurs at a low electric field.

On the other hand, in the embodiment, due to the heating at 1500° C. to 1700° C., evaporation occurs on the tip surface to some extent, and the effect of electric field is also applied thereto such that thermal field evaporation occurs. A characteristic of the thermal field evaporation is that, unlike the evaporation caused by only heating, the sharp portion of the tip is preferentially evaporated such that the tip front end is processed into a shape similar to a hemispherical as a whole.

Next, the second effect will be described. In general, it is known that, when a strong electric field is applied to the heated tip, atomic diffusion of the surface caused by an electrostatic force occurs such that a crystal plane having a high atomic density largely grows and is built up, for example, in a Zr—O/W {100} tip for a Schottky electron source.

As a result of thorough investigation, the present inventors found that, even in the tip of the hexaboride single crystal with the <100> axis, the build-up of the {100} plane occurs in the tip front end heated by the application of the electric field. In addition, it was found that the electric field for the build-up has no polarity dependence and the {100} plane can be built up irrespective of whether the polarity is positive or negative.

Here, when the polarity is negative, the above-described effect of the field evaporation cannot be obtained, and a large amount of electrons are emitted from the tip of the hexaboride single crystal to which a high temperature and a high electric field are applied. Therefore, the vacuum degree decreases due to the production of gas desorbed by electron beam stimulation such that there is a risk of discharge damage or the like. Therefore, in the manufacturing method according to the embodiment, it is preferable that the electric field to be applied has positive polarity.

In the embodiment, by combining the effect of the thermal field evaporation and the effect of the build-up, the front end shape of the tip 4 of the hexaboride single crystal with the <100> axis can be processed, in which a top facet of a {100} plane that is surrounded by side facets including at least four {n11} planes having a high work function and at least four {n10} planes having a low work function where n represents an integer of 1, 2, or 3 is formed at a front end of the tip of the hexaboride single crystal, and a total area of the side facets of the {n11} planes is more than a total area of the side facets of the {n10} planes. The reason for this is as follows. Due to the effect of the thermal field evaporation, a shaper portion than the curvature of the entire surface of the tip front end such as the {310} or (110) plane is cut and is difficult to grow. In addition, due to the effect of the build-up, the growth of the high-density crystal planes including the {100} plane at the top of the tip and the {111} planes at the side surrounding the {100} plane is promoted.

Figure 13A:
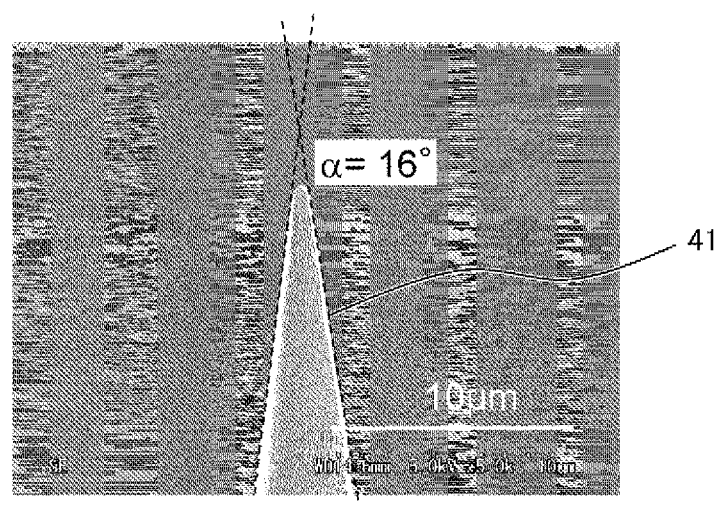
Figure 13B:
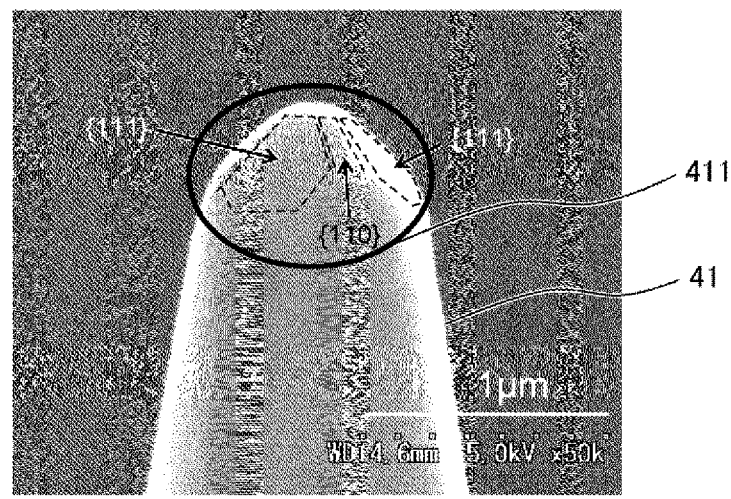
Figure 13C:
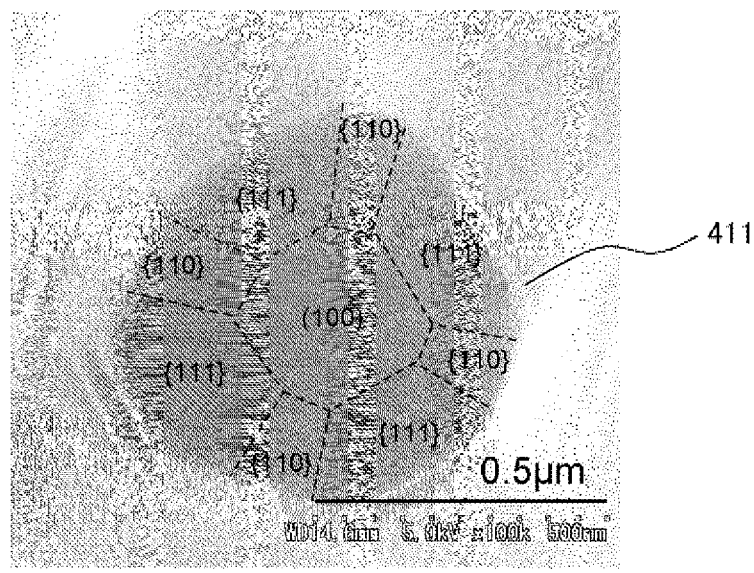

FIG. 13 shows a SEM image showing a front end portion 41 of the tip 4 of the hexaboride single crystal that is processed using the method according to the embodiment. As shown in the SEM image of FIG. 13(*a*), due to the thermal field evaporation, the front end portion 41 of the tip 4 is reduced in diameter as a whole as compared to the front end portion 40 shown in FIG. 12(*a*), and the cone angle α in a range of about 10 μm from the front end portion 41 of the tip 4 is 16° that is smaller than 20° as the value immediately after the electrolytic polishing shown in FIG. 12(*a*).

In addition, as in the enlarged SEM image showing the front end portion 41 in FIG. 13(*b*) and the SEM image showing the front end portion 41 in FIG. 13(*c*) when seen from the axis direction of the tip 4, the facet of the {100} plane is formed at the top of the front end portion 41 of the tip 4, four {111} planes are formed at the side of the front end portion 41, four (110) planes are formed therebetween, and the area of the {111} planes is more than the area of the {110} planes.

Although the discrimination is difficult in the SEM image of FIG. 13(*c*), a small {311} plane or {211} plane is formed at a boundary between the {100} plane and the {111} plane, and a small {310} plane or (210) plane is formed at a boundary between the {100} plane and the (110) plane. These high-index planes are more likely to be formed as the front end curvature of the tip increases and the inclination angle of a transition region from the {100} plane to the {111} plane or the (110) plane becomes more gentle.

Therefore, in particular, in order to suppress the growth of the {310} plane or (210) plane having a low work function and to reduce unnecessary electron emission, it is preferable that the curvature radius R of an approximate circle of the prepared tip front end is as low as possible. Specifically, it is preferable that R≤0.5 μm is satisfied.

In addition, in order to reduce the diameter of a light source, it is desirable to reduce R. However, when R is excessively low, the size of the top facet of the {100} plane is also reduced, and a sufficient probe current cannot be achieved. Accordingly, 0.2 μm≤R≤0.5 μm may be satisfied.

In addition, due to the same reason, it is preferable that an area A of the top facet of the {100} plane satisfies 0.01≤A≤0.1 mm², and it is preferable that a cone angle α of the tip front end satisfies 25°≥α≥10°. When the cone angle is excessively large, R is likely to be large, and when the cone angle is excessively small, R or the facet size is likely to be small. These configurations can be controlled by controlling the processing shape in the electrolytic polishing according to the present invention and controlling the temperature, the electric field, and the time of the thermal field evaporation that is subsequently performed.

FIG. 14 is a schematic diagram showing the structure of the tip 4 of the hexaboride single crystal according to the embodiment having the above-described characteristic in combination. The schematic diagram of FIG. 14 corresponds to 410 surrounded by a circle in the front end portion 41 of the tip 4 of the hexaboride single crystal shown in the SEM image of (b) of FIG. 13. In the front end portion 41 of the tip 4 of the hexaboride single crystal according to the embodiment, the cone angle α is 25° to 10°. At a top 411 of the front end portion 41, the {100} plane is formed in a size of 0.01 to 0.1 mm². In addition, the {n11} plane and the {n10} plane (n=1, 2, 3) are alternately arranged at a side 412 to surround the {100} plane, and the total area of the {n11} planes is more than the total area of the {n10} planes.

FIG. 15 shows a configuration of an electron source 100 manufactured using the method according to the embodiment. By processing the front end portion of the tip 4 of the structure 1001 of the electron source described with reference to FIG. 7 using the above-described method, the front end portion 41 is formed, the front end portion 41 including: the top 411 where the {100} plane is formed; and the side 412 where the {n11} plane and the {n10} plane (n=1, 2, 3) are alternately arranged to surround the top 411.

FIG. 16 collectively shows comparison of conditions between the manufacturing method of the front end portion 41 of the tip 4 of the hexaboride single crystal according to the embodiment and the related art, and is a map showing the method of processing the tip front end of the hexaboride single crystal with the <100> axis with respect to the heating temperature and the field intensity of the positive polarity to be applied. A region 152 is a region disclosed in the conventional example such as PTL 1 or 4, in which the heating temperature is low at 1500° C. or lower, and when an electric field is not applied or when only a low electric field having a field intensity of $4.5 \times 10^9$ V/m or lower is applied, the reconfiguration of the crystal planes occurs due to atomic migration mainly caused by heating, the facet of the {100} plane is formed at the top, and the side facets of the {n10}>{n11} planes are formed at the side.

On the other hand, in a region 151 according to the embodiment, when the tip is heated at 1500° C. to 1700° C. and concurrently an electric field of 1 to $4.5 \times 10^9$ V/m is applied to the tip, the effect of the thermal field evaporation and the effect of the build-up are combined, and the facet of the {100} plane is formed at the top, and the side facets of the {n11}>{n10} planes are formed at the side. In the other regions 153 to 155, heating, electric field application, or evaporation by both of heating and electric field application is predominant, and the tip front end shape described in the embodiment is not formed. In order to improve the effect of the build-up to reduce the process time for forming the facets to about 30 minutes to 1 hour, it is most preferable that an electric field of 3 to $4.5 \times 10^9$ V/m is applied even in the region 151.

FIG. 17 shows the result of observing field electron emission at room temperature from the electron source with a field emission microscope, in which (a) shows the case of the hexaboride single crystal electron source prepared using the manufacturing method in the related art and (b) shows the case of the hexaboride single crystal electron source prepared in the embodiment. In the field emission microscope, electron emission from each of the crystal planes of the tip front end can be enlarged and projected to a fluorescent screen.

Figure 17A:
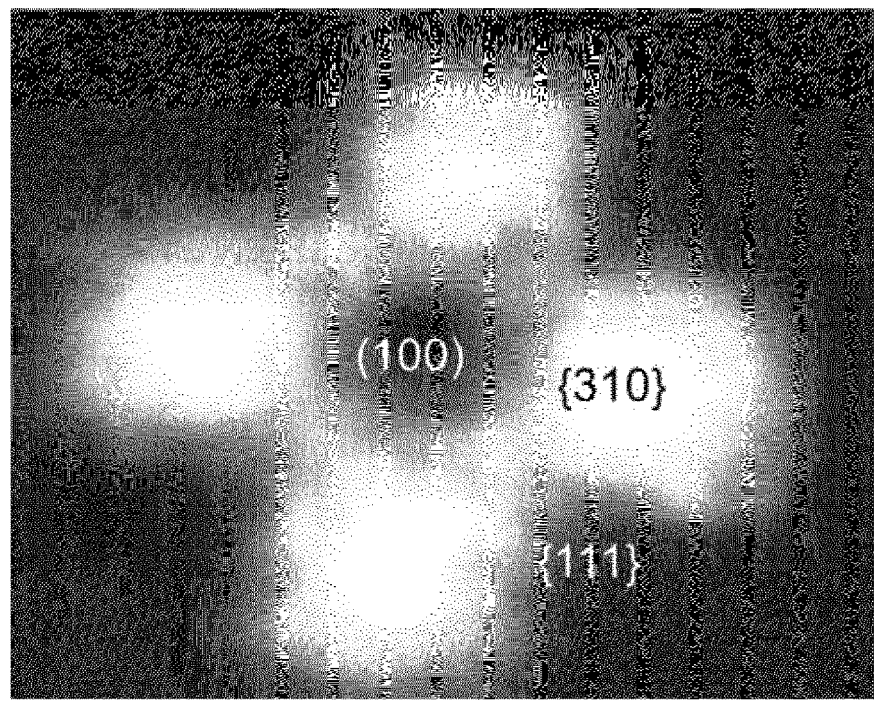

In the hexaboride single crystal electron source in the related art in FIG. 17(a), an electron emission pattern from the {310} planes with 4-fold symmetry that are wide and bright is observed around the electron emission from the {100} plane at the center. The area of the {310} plane is more than the area of the {111} planes, and unnecessary electron emission in a region other than the optical axis is large.

Figure 17B:
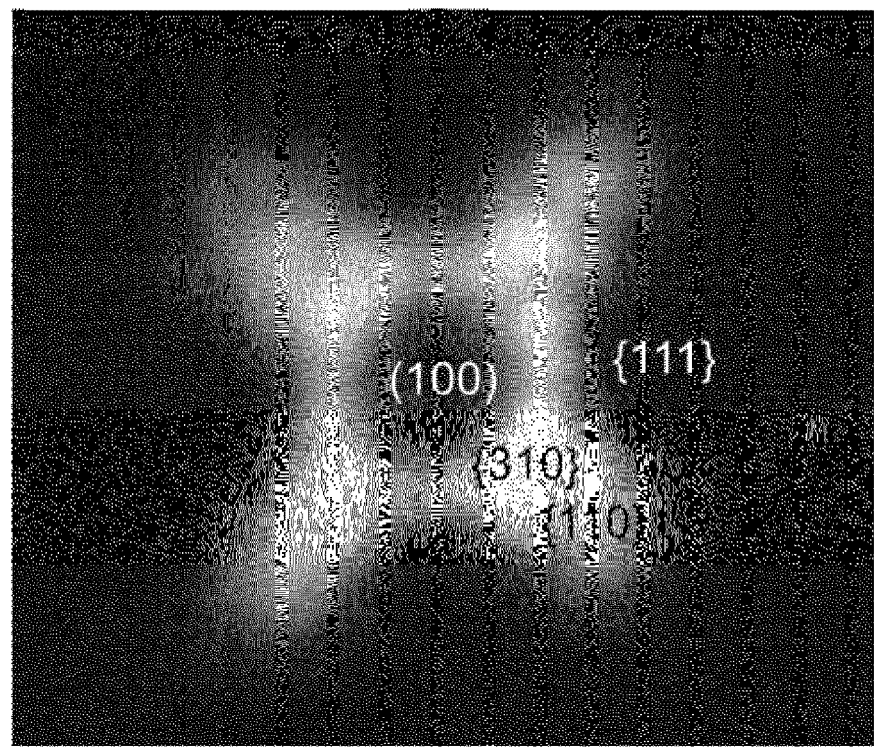

On the other hand, in the hexaboride single crystal electron source prepared in the embodiment of FIG. 17(b), the electron emission area from the {310} planes or the {110} planes with 4-fold symmetry around the electron emission from the {100} plane at the center is small, the total area of the {310} to {110} planes is less than the total area of the {111} planes, and unnecessary electron emission in a region other than the optical axis is less than that of the hexaboride single crystal electron source in the related art of FIG. 16(a).

FIG. 18 shows the results of measuring a total current It (A) of the entire tip and an angular current density $J_\Omega$ (μA/sr) of a probe current extracted from the electron emission portion of the top {100} plane when each of the hexaboride single crystal electron source prepared using the manufacturing method in the related art and the hexaboride single crystal electron source prepared using the manufacturing method according to the embodiment performs field emission at room temperature. 181 represents the measurement result of the embodiment, and 182 represents the measurement result of the conventional example.

$J_\Omega$/It (corresponding to the inclination of the curve 182 in FIG. 18) of the hexaboride single crystal electron source which is prepared using the manufacturing method in the related and in which the total area of the {n10} planes is equal to the total area of the {n11} planes is low at about 0.8 to 1. On the other hand, $J_\Omega$/It t (corresponding to the inclination of the curve 181 in FIG. 18) of the hexaboride single crystal electron source which is prepared using the manufacturing method according to the embodiment and in which the total area of the {n10} planes is equal to the total area of the {n11} planes is 2.6 to 4, which is significantly improved by 3.25 to 4 times as compared to the curve 182 corresponding to the hexaboride single crystal electron source prepared using the manufacturing method in the related art.

FIG. 19 shows the result of comparing the values of energy full width at half maximum of emitted electrons in the field emission electron source using the hexaboride single crystal where the {100} plane is used at the top according to the embodiment, the hexaboride field emission electron source where the {310} plane is used at the top in the related art, and the W field emission electron source where the {310} plane is used at the top in the related art.

FIG. 19 shows a relationship between the angular current density and the energy full width at half maximum of emitted electrons, in which 191 represents the field emission electron source using the hexaboride single crystal where the {100} plane is used at the top according to the embodiment, 192 represents the hexaboride field emission electron source where the {310} plane is used at the top in the related art, and 193 represents the W field emission electron source where the {310} plane is used at the top in the related art.

The work function of the {100} plane of the hexaboride is 2.7 to 2.8 eV, which is presumed to be higher than that of the {310} plane by about 0.2 to 0.3 eV. However, the work function of the {100} plane of the hexaboride is lower than 4.3 eV of the W {310} plane by 1.5 eV or higher. Therefore, the energy width is slightly wider than that of the field emission electron source using the {310} plane of the hexaboride single crystal but the energy full width at half maximum is narrower than that of the field emission electron source using the W {310} plane. As a result, the field emission electron source using the hexaboride single crystal can be used as an electron source having good monochromaticity.

Figure 20A:
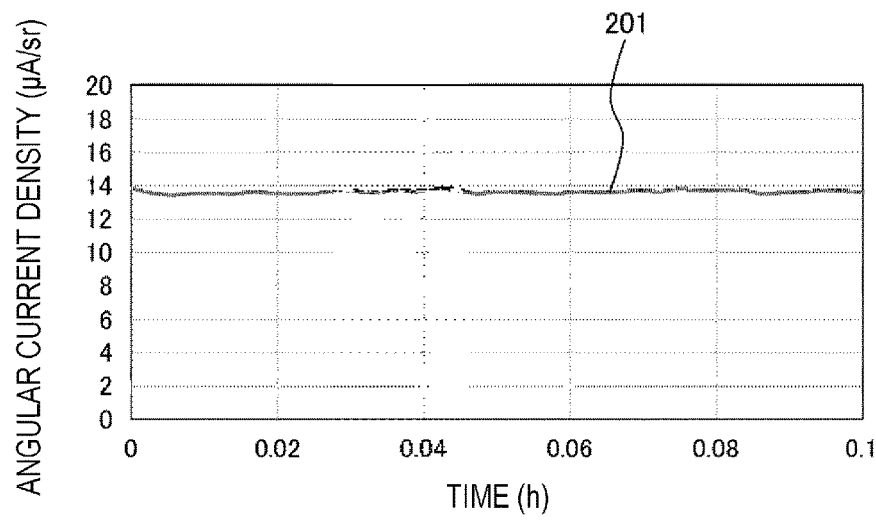
Figure 20B:
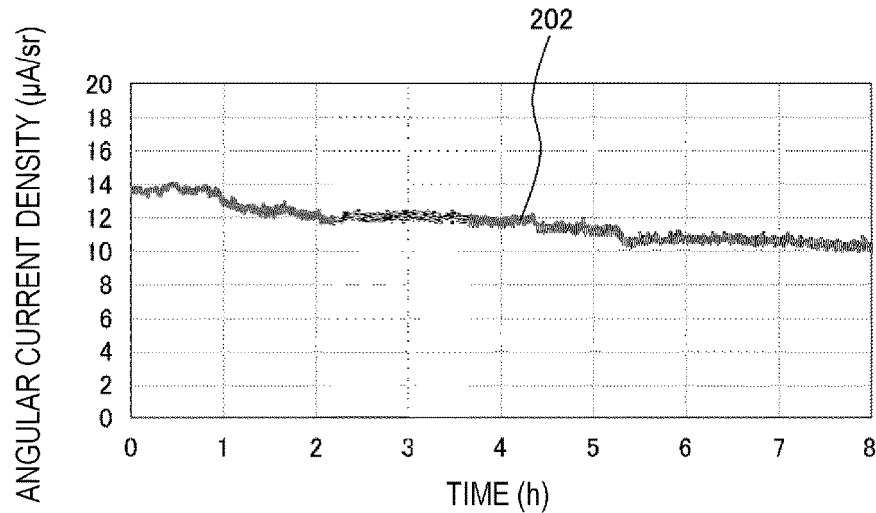

FIG. 20 shows the result of evaluating the stability of current when the electron source 100 using the tip 4 of the hexaboride single crystal where the {100} plane is used at the top according to the embodiment performs cold field emission at room temperature in an electron gun. The emission current noise of a current value 201 in a short period of time is ±2 to 4% as shown in FIG. 20(a), and the attenuation amount of a current value 202 in a long period of time is also small at about 25% in 8 hours as shown in FIG. 20(b). By performing flushing once per day, current stability required as a field emission electron source used in a general-purpose electron microscope can be obtained.

Figure 21A:
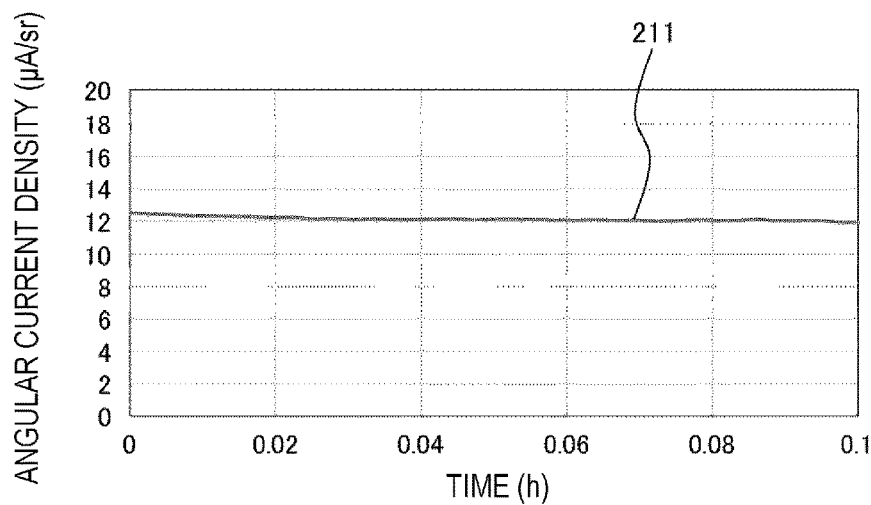
Figure 21B:
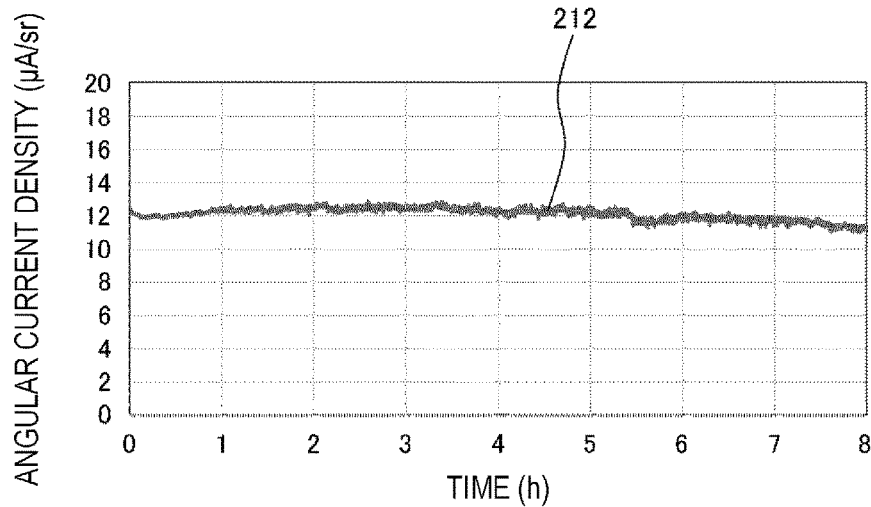

FIG. 21 shows the result of evaluating current stability during operation in a thermal field emission mode where the electron source 100 using the tip 4 of the hexaboride single crystal is heated to 160° C. The emission current noise in a short period of time is ±2 to 3% as in the current value indicated by a curve 211 in FIG. 21(a), the attenuation amount of the current in 8 hours is lower at about 10% as indicated by a curve 212 in FIG. 21(b), and the stability is improved. The improvement of the stability in the thermal field emission mode is effective in a heating range of about 100° C. to 300° C.

This way, in the embodiment, the front end shape of the tip of the hexaboride single crystal with the <100> axis can be processed, in which a top facet of a {100} plane that is surrounded by side facets including at least four {n11} planes having a high work function and at least four {n10} planes having a low work function where n represents an integer of 1, 2, or 3 is formed at a front end of the tip of the hexaboride single crystal, and a total area of the side facets of the {n11} planes is more than a total area of the side facets of the {n10)}planes. As a result, the stable field emission electron source having a small current fluctuation can be realized.

As described above, in the embodiment, the electron source using the tip of the hexaboride single crystal with the <100> axis has the configuration in which a top facet of a {100} plane that is surrounded by side facets including at least four {n11} planes having a high work function and at least four {n10} planes having a low work function where n represents an integer of 1, 2, or 3 is formed at a front end of the tip of the hexaboride single crystal, and a total area of the side facets of the {n11} planes is more than a total area of the side facets of the {n10} planes.

Further, an area A of the top facet of the {100} plane of the tip of the hexaboride single crystal satisfies $0.01 \leq A \leq 0.1$ μm$^2$, a curvature radius R of an approximate circle of the tip front end satisfies $0.2 \leq R \leq 0.5$ μm, and a cone angle α of the cone of the tip front end satisfies $25° \geq α \geq 10°$. As a result, the above-described electron source can be realized more effectively.

The above-described electron source can be manufactured by heating a single crystal tip obtained by sharpening a single front end of a rod of the hexaboride single crystal with the <100> axis by electrolytic polishing or the like at 1500° C. or higher and 1700° C. or lower and applying an electric field having positive polarity of $1 \times 10^9$ V/m or higher and $4.5 \times 10^9$ V/m or lower and preferably $3 \times 10^9$ V/m or higher and $4.5 \times 10^9$ V/m or lower to the single crystal tip.

In the embodiment, the ratio between the angular current density $J_\Omega$ (μA/sr) of the probe current extracted from the electron emission portion of the top {100} plane of the electron source using the tip of the hexaboride single crystal and the total current It emitted from the electron source is 2 or higher. Therefore, the stable electron source having a better monochromaticity and a smaller current fluctuation as compared to the related art can be realized.

As described above in the embodiment, the above-described electron source can be used as a cold cathode field emission electron source that operates at a temperature of room temperature or lower, a thermal field emission electron source that is heated to a relatively low temperature of about 100° C. to 300° C. and operates, or a Schottky electron source that is heated to about 1050° C. to 1400° C. and operates.

Embodiment 2

In Embodiment 2, an example where the electron source 100 using the tip of the hexaboride single crystal prepared in Embodiment 1 is heated to about 1050° C. to 1400° C. and operates in a Schottky mode will be described. The work function of a {100} plane of a hexaboride CeB$_6$ single crystal is about 2.7 to 2.8 eV, which is lower than 2.9 V of the work function of the Zr—O/W Schottky electron source in the related art by about 0.2 to 0.3 eV. Therefore, it is expected that Schottky electron emission having better monochromaticity at the same angular current density can be obtained.

FIG. 22 shows the result of comparing the values of energy full width at half maximum with respect to the values of the angular current density between a case where the electron source 100 using the tip of the hexaboride single crystal operates at 1327° C. and a case where the Zr—O/W electron source in the related art operates at 1427° C. A curve 221 represents characteristics of the energy full width at half maximum with respect to the angular current density in the electron source 100 using the tip of the hexaboride single crystal, and a curve 222 represents characteristics of the energy full width at half maximum with respect to the angular current density in the Zr—O/W electron source in the related art. It can be seen that the energy full width at half maximum at the same angular current density in the electron source 100 using the tip of the hexaboride single crystal is lower than that of the Zr—O/W electron source in the related art by 0.1 eV or higher, and a Schottky electron source having higher monochromaticity can be realized.

Figure 23A:
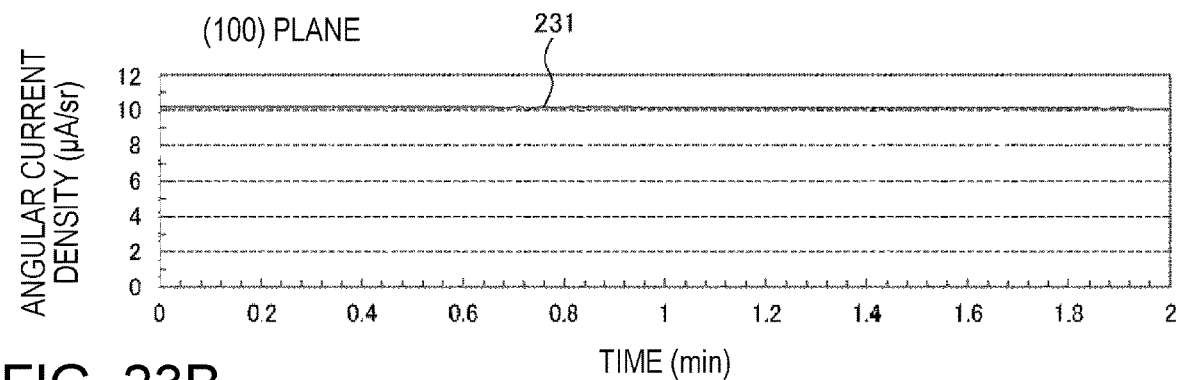
Figure 23B:
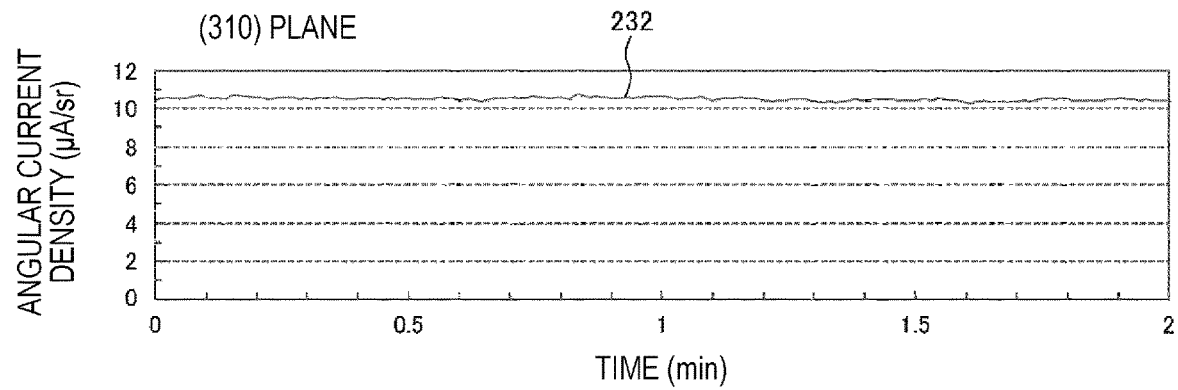

FIG. 23 shows the result of comparison of the current stability in a short period of time between the {100} plane of the tip 4 of the hexaboride single crystal described in Embodiment 1 and the Schottky electron source using the {310} plane. (a) of FIG. 23 shows a time change of the angular current density in the (100) plane as {100} plane, and (b) of FIG. 23 shows a time change of the angular current density in the (310) plane as {310} plane.

In the Schottky electron source, the emission current is more stable than the cold field emission electron source or the like. However, as compared to ±3% to 4% that is the noise of the Schottky electron source using the {310} plane, the noise of the emission current in the Schottky electron source according to the present invention using the {100} plane is small at ±1%, and it can be seen that the stability is further improved.

In the embodiment, when the electron source 100 using the tip of the hexaboride single crystal prepared in Embodiment 1 operates in the Schottky mode, Schottky electron emission where the monochromaticity is higher at the same angular current density, the noise is smaller, and the stability is improved as compared to the Schottky electron source in the related art can be obtained. In the Schottky electron source, significant current attenuation does not appear unlike the field emission electron source. Therefore, the present invention is also applicable to length measurement or the like of a semiconductor device where long term stability is required.

Embodiment 3

Embodiment 3 will be described using FIG. 24. Features that are described in the Embodiment 1 or 2 and are not described in Embodiment 3 can also be applied to Embodiment 3 unless specified otherwise. Embodiment 3 shows an example of a scanning electron microscope 1000 where the electron source (field emission electron source) 100 where the {100} plane of the tip 4 of the CeB$_6$ hexaboride single crystal prepared and evaluated in Embodiment 1 is used as the electron emission surface is mounted. In Embodiment 3, the scanning electron microscope 1000 using the field emission electron source 100 according to Embodiment 1 is used as the example for the description. However, the Schottky electron emission source according to Embodiment 2 may be used, and the type of the electron beam apparatus is not limited to the scanning electron microscope.

FIG. 24 is a schematic view showing the scanning electron microscope 1000 according to Embodiment 3. The field emission electron source 100 is normally heated by causing a given current to flow through a heating power supply 103 controlled by a computer 101 and a controller 102, and emits electrons by field emission by causing an extraction power supply 104 to apply a positive voltage to an extraction electrode 105 with respect to the front end of the tip 4.

An emitted electron beam 106 is accelerated to a positive electrode 108 that is grounded by a negative high voltage applied by an acceleration power supply 107, is focused by a first condenser lens 109, a diaphragm 110, a second condenser lens 111, an objective lens 112, an astigmatism correction coil 113, and is scanned by a deflection scanning coil 114 to irradiate an observation region of a sample 115. As a result, the formed secondary electrons are detected by a secondary electron detector 116.

The embodiment shows the example of the two-electrode configuration including the extraction electrode 105 and the positive electrode 108. However, a three-electrode configuration where a control electrode is provided between the extraction electrode 105 and the positive electrode 108 or a four-electrode configuration where a suppressor electrode is provided in front of the extraction electrode 105 to surround the tip may be adopted. As the detector, a detector other than the secondary electron detector is not shown. However, for example, a backscattered electron detector or an element analyzer is also used.

In the electrons emitted from the field emission electron source 100 where the {100} plane of the tip 4 of the hexaboride single crystal is used as the electron emission surface, as shown in FIG. 19, the energy full width at half maximum is narrower and the monochromaticity is higher than those of the field emission electron source using the W {310} plane in the related art. Therefore, the chromatic aberration in the objective lens 112 or the like is reduced, the sample 115 can be irradiated with the more focused electron beam 106, and thus, the scanning electron microscope image with high resolution can be obtained.

In addition, in the electrons emitted from the field emission electron source 100, the monochromaticity is good, and the spread from the electron source is small. Therefore, as compared to the electron source in the related art, unnecessary electron irradiation to a member around the electron source can be reduced, and contamination on the sample to be irradiated with the electron beam can be reduced.

Even when the Schottky electron emission source where the {100} plane of the tip 4 of the hexaboride single crystal is used as the electron emission surface is used, as shown in FIG. 22, the energy full width at half maximum is narrower and the monochromaticity is higher than those of the Schottky emission electron source using the Zr—O/W {110} plane in the related art. Therefore, the same improvement effects can be obtained.

The embodiments have been described in detail in order to easily describe the present invention, and the present invention is not necessarily to include all the configurations described above. In addition, a part of the configuration of one embodiment can be replaced with the configuration of another embodiment. Further the configuration of one embodiment can be added to the configuration of another embodiment. In addition, addition, deletion, and replacement of another configuration can be made for a part of the configuration of each of the embodiments.

REFERENCE SIGNS LIST

1: metal atom
2: boron atom
3: single crystal
4: tip
11: metal tube
12: guide pin
13: pedestal
14: paste
15: blade
16: stereoscopic microscope
17: recess part
18: filament
19: stem
20: electrode
21-1, 21-2: alignment jig
22: electrolytic solution
23: counter electrode
24: power supply
100: field emission electron source
101: computer
102: controller
103: heating power supply
104: extraction power supply
105: extraction electrode
106: electron beam
107: acceleration power supply
108: positive electrode
109: first condenser lens
110: diaphragm
111: second condenser lens
112: objective lens
113: astigmatism correction coil
114: deflection scanning coil
115: sample
116: secondary electron detector

The invention claimed is:

1. An electron source characterized by comprising a tip of a hexaboride single crystal with a <100> axis,
   wherein a top facet of a {100} plane that is surrounded by side facets including at least four {n11} planes and at least four {n10} planes where n represents an integer of 1, 2, or 3 is formed at a front end of the tip of the hexaboride single crystal, and
   a total area of the side facets of the {n11} planes is more than a total area of the side facets of the {n10} planes.

2. The electron source according to claim 1, wherein the {n11} plane of the tip of the hexaboride single crystal has a higher work function than the {n10} plane.

3. The electron source according to claim 1, wherein the electron source including the tip of the hexaboride single crystal is a cold cathode field emission electron source that operates at a temperature of room temperature or lower.

4. The electron source according to claim 1, wherein the electron source including the tip of the hexaboride single crystal is a thermal field emission electron source that is heated to a temperature of higher than room temperature and 300° C. or lower and operates.

5. The electron source according to claim 1, wherein the electron source including the tip of the hexaboride single crystal is a Schottky electron emission source that is heated to a temperature of 1050° C. or higher and 1400° C. or lower and operates.

6. The electron source according to claim 1, wherein an area A of the top facet of the {100} plane of the hexaboride single crystal satisfies 0.01≤A≤0.1 µm².

7. The electron source according to claim 1, wherein a curvature radius R of an approximate circle of a front end of the tip of the hexaboride single crystal satisfies 0.2≤R≤0.5 µm.

8. The electron source according to claim 1, wherein a front end portion of the tip of the hexaboride single crystal is formed in a conical shape, and a cone angle a of the portion that is formed in the conical shape satisfies 25°≥α≥10°.

9. A method of manufacturing an electron source including a tip of a hexaboride single crystal with <100> orientation, the method comprising:
electrolytically polishing a front end portion of the tip of the hexaboride single crystal to form the front end portion of the tip in a conical shape; and
heating the tip of the hexaboride single crystal where the front end portion is formed in the conical shape and concurrently applying a voltage having positive polarity with respect to the tip of the hexaboride single crystal such that a top facet of a {100} plane that is surrounded by side facets including at least four {n10} planes and at least four {n10} planes where n represents an integer of 1, 2, or 3 is formed on a side wall of a front end of the front end portion of the tip of the hexaboride single crystal that is formed in the conical shape,
wherein a total area of the side facets of the {n11} planes is more than a total area of the side facets of the {n10} planes.

10. The method of manufacturing an electron source including the tip of the hexaboride single crystal according to claim 9,
wherein
the tip of the hexaboride single crystal where the front end portion is formed in the conical shape is heated and a voltage having positive polarity is concurrently applied with respect to the tip of the hexaboride single crystal by heating the tip of the hexaboride single crystal to 1500° C. or higher and 1700° C. or lower and applying a voltage of $1 \times 10^9$ V/m or higher and $4.5 \times 10^9$ V/m or lower as a positive potential with respect to the tip of the hexaboride single crystal.

11. An electron beam apparatus comprising:
an electron source;
a sample stage on which a sample is mounted; and
an electron optical system that focuses electrons emitted from the electron source into a beam shape and irradiates the sample on the sample stage with the focused beam,
wherein the electron source includes a tip of a hexaboride single crystal with a <100>axis,
a top facet of a {100} plane that is surrounded by side facets including at least four {n11} planes and at least four {n10} planes where n represents an integer of 1, 2, or 3 is formed at a front end of the tip of the hexaboride single crystal, and a total area of the side facets of the {n11} planes is more than a total area of the side facets of the {n10} planes.

12. The electron beam apparatus according to claim 11, wherein
the electron source is a cold cathode field emission electron source that operates at a temperature of room temperature or lower.

13. The electron beam apparatus according to claim 11, wherein
the electron source is a thermal field emission electron source including a heat source that heats the electron source at a temperature of higher than room temperature and 300° C. or lower.

14. The electron beam apparatus according to claim 11, wherein
the electron source is a Schottky electron emission source including a heat source that heats the electron source in a range of 1050° C. to 1400° C.

15. The electron beam apparatus according claim 11, wherein
a ratio between an angular current density $J_{106}$ (µA/sr) of a probe current extracted from the {100} plane of the top facet of the tip of the hexaboride single crystal of the electron source and a total current It emitted from the electron source is 2 or higher.

* * * * *